United States Patent
Pan et al.

(10) Patent No.: US 11,356,202 B2
(45) Date of Patent: Jun. 7, 2022

(54) EFFICIENT BROADCAST CHANNEL IN BEAMFORMED SYSTEMS FOR NR

(71) Applicant: IDAC HOLDINGS, INC., Wilmington, DE (US)

(72) Inventors: Kyle Jung-Lin Pan, Saint James, NY (US); Fengjun Xi, San Diego, CA (US); Robert L. Olesen, Huntington, NY (US); Chunxuan Ye, San Diego, CA (US); Janet A. Stern-Berkowitz, Little Neck, NY (US)

(73) Assignee: IDAC Holdings, Inc., Wilimington, DE (US)

( * ) Notice: Subject to any disclaimer, the term of this patent is extended or adjusted under 35 U.S.C. 154(b) by 0 days.

(21) Appl. No.: 16/336,803

(22) PCT Filed: Sep. 28, 2017

(86) PCT No.: PCT/US2017/054160
§ 371 (c)(1),
(2) Date: Mar. 26, 2019

(87) PCT Pub. No.: WO2018/064407
PCT Pub. Date: Apr. 5, 2018

(65) Prior Publication Data
US 2019/0238270 A1 Aug. 1, 2019

Related U.S. Application Data

(60) Provisional application No. 62/454,491, filed on Feb. 3, 2017, provisional application No. 62/416,615, filed
(Continued)

(51) Int. Cl.
*H04W 4/00* (2018.01)
*H04L 1/00* (2006.01)
(Continued)

(52) U.S. Cl.
CPC .......... *H04L 1/0067* (2013.01); *H03M 13/09* (2013.01); *H04B 7/0617* (2013.01);
(Continued)

(58) Field of Classification Search
CPC ..................................................... H04L 1/0067
See application file for complete search history.

(56) References Cited

U.S. PATENT DOCUMENTS 9,042,240 B2  5/2015  Luo et al.
10,660,102 B1 *  5/2020  Patel .................... H04W 48/00
(Continued)

FOREIGN PATENT DOCUMENTS

CN  103414540 A  11/2013
CN  105811998 A  7/2016

OTHER PUBLICATIONS

Catr, "Considerations on channel coding for NR," 3GPP TSG RAN WG1 Meeting #84bis, R1-163130, Busan, Korea (Apr. 11-15, 2016).
(Continued)

*Primary Examiner* — Guang W Li
(74) *Attorney, Agent, or Firm* — Flaster Greenberg, P.C.

(57) ABSTRACT

A method for transmitting system information on a PBCH is described herein. A transmission/reception point (TRP) may generate a concatenated master information block (MIB) transport block that includes information bits associated with system bandwidth information, timing information, system frame number (SFN), a beam sweeping configuration, and a control resource set (CORESET). The TRP may then attach at least 16 cyclic redundancy check (CRC) bits to the concatenated MIB and then prioritize the concatenated MIB and the at least 16 CRC bits based on content. The TRP may then perform channel coding of the prioritized concatenated MIB and the at least 16 CRC bits to produce coded
(Continued)

bits using at least one polar encoder with a coding rate that is less than ⅓, perform rate matching via repetition on the coded bits, and then transmit the rate matched, coded bits on the PBCH of a radio frame.

20 Claims, 28 Drawing Sheets

Related U.S. Application Data on Nov. 2, 2016, provisional application No. 62/401,024, filed on Sep. 28, 2016.

(51) Int. Cl.
    *H04B 7/06*     (2006.01)
    *H03M 13/09*    (2006.01)
    *H04W 74/08*    (2009.01)
    *H04W 48/10*    (2009.01)

(52) U.S. Cl.
    CPC ......... *H04B 7/0623* (2013.01); *H04B 7/0695* (2013.01); *H04L 1/007* (2013.01); *H04L 1/0057* (2013.01); *H04L 1/0061* (2013.01); *H04L 1/0072* (2013.01); *H04W 74/0833* (2013.01); *H04W 48/10* (2013.01)

(56) References Cited

U.S. PATENT DOCUMENTS

| | | | |
|---|---|---|---|
| 2001/0044294 A1* | 11/2001 | Khayrallah | H04M 15/745 455/406 |
| 2014/0112220 A1* | 4/2014 | Kwak | H04B 7/0695 370/294 |
| 2015/0092886 A1 | 4/2015 | Ionita et al. | |
| 2015/0358100 A1* | 12/2015 | Jung | H04L 1/00 370/329 |
| 2016/0036465 A1* | 2/2016 | Kuo | H03M 13/3938 714/792 |
| 2016/0164629 A1 | 6/2016 | Ahn et al. | |
| 2016/0227583 A1* | 8/2016 | Chavva | H04W 4/70 |
| 2016/0353415 A1* | 12/2016 | Sarkar | H04W 72/042 |
| 2017/0005753 A1* | 1/2017 | Shen | H04L 1/1819 |
| 2017/0047947 A1* | 2/2017 | Hong | H03M 13/2906 |
| 2017/0171897 A1* | 6/2017 | Ryu | H04L 5/006 |
| 2017/0187488 A1* | 6/2017 | Rico Alvarino | H03M 13/09 |
| 2017/0331577 A1* | 11/2017 | Parkvall | H04W 8/18 |
| 2017/0366206 A1* | 12/2017 | Zhang | H04L 1/0069 |
| 2018/0070369 A1* | 3/2018 | Papasakellariou | H04W 16/14 |
| 2018/0131491 A1* | 5/2018 | Xiong | H04L 1/0061 |
| 2018/0159671 A1* | 6/2018 | Kim | H04J 11/0069 |
| 2018/0213495 A1* | 7/2018 | Kim | H04W 56/001 |
| 2018/0343571 A1* | 11/2018 | Kim | H04W 16/24 |
| 2019/0104502 A1* | 4/2019 | Wu | H04L 1/007 |
| 2019/0123860 A1* | 4/2019 | Xu | H04L 1/1861 |
| 2019/0166611 A1* | 5/2019 | Noh | H04L 1/0072 |
| 2019/0215720 A1* | 7/2019 | Li | H04W 28/06 |
| 2019/0312681 A1* | 10/2019 | Luo | H04L 1/0061 |
| 2019/0334654 A1* | 10/2019 | Luo | H03M 13/13 |
| 2019/0356417 A1* | 11/2019 | Rong | H04L 1/0008 |
| 2019/0356420 A1* | 11/2019 | John Wilson | H04L 1/0068 |
| 2020/0007161 A1* | 1/2020 | Dikarev | H03M 13/2789 |

OTHER PUBLICATIONS

Convida Wireless et al., "Discussion of PBCH Transmission in NR," 3GPP TSG RAN WG1 Meeting #87, R1-1613008, Reno, USA (Nov. 14-18, 2016).
Du et al., "Exploiting the UEP Property of Polar Codes to Reduce Image Distortions Induced by Transmissions Errors," International Conference on Communications in China (ICCC) (Nov. 2015).
El Hattachi et al., "NGMN 5G White Paper," Version 1.0 (Feb. 2015).
Fujitsu, "Discussion on initial access in NR," 3GPP TSG RAN WG1 Meeting #86, R1-166678, Gothenburg, Sweden (Aug. 22-26, 2016).
Interdigital Communications et al., "Considerations for DL Broadcast Channel for Initial Access in NR," 3GPP TSG RAN WG1 Meeting #87, R1-1612628, Reno, USA (Nov. 14-18, 2016).
Interdigital Communications, "Considerations for DL Broadcast Channel," 3GPP TSG RAN WG1 Meeting #86bis, R1-1610356, Lisbon, Portugal (Oct. 10-14, 2016).
Interdigital Communications, "Performance Evaluation for Beam Centric Design for Broadcast Channel," 3GPP TSG RAN WG1 Meeting #87, R1-1612630, Reno, USA (Nov. 14-18, 2016).
International Telecommunciation Union, "IMT Vision—Framework and overall objectives of the future development of IMT for 2020 and beyond; M Series Mobile, radiodetermination, amateur and related satellite services," Recommendation ITU-R M.2083-0 (Sep. 2015).
Mediatek Inc., "Examination of NR Coding Candidates for Low-Rate Applications," 3GPP TSG RAN WG1 Meeting #86, R1-167871, Gothenburg, Sweden (Aug. 22-26, 2016).
Panasonic, "Use of multiple numerologies in NR," 3GPP TSG RAN WG1 Meeting #86, R1-167439, Gothenburg, Sweden (Aug. 22-26, 2016).
Samsung, "Overview on issues for NR initial access," 3GPP TSG RAN WG1 Meeting #86, R1-166796, Gothenburg, Sweden (Aug. 22-26, 2016).
Third Generation Partnership Project, "Technical Specification Group Radio Access Network; Study on Scenarios and Requirements for Next Generation Access Technologies; (Release 14)," 3GPP TR 38.913 V0.3.0 (Mar. 2016).
Third Generation Partnership Project, "Technical Specification Group Radio Access Network; Study on Scenarios and Requirements for Next Generation Access Technologies; (Release 14)," 3GPP TR 38.913 V0.4.0 (Jun. 2016).
Third Generation Partnership Project, "Technical Specification Group Radio Access Network; Study on Scenarios and Requirements for Next Generation Access Technologies; (Release 14)," 3GPP TR 38.913 V14.3.0 (Jun. 2017).
Xinwei, "Considerations on Initial Access Design," 3GPP TSG RAN WG1 Meeting #86, R1-166586, Gothenburg, Sweden (Aug. 22-26, 2016).
Huawei et al., "Channel Coding for PBCH," 3GPP TSG RAN WG1 Meeting #88, R1-1701704, Athens, Greece (Feb. 13-17, 2017).
Kong, "Research on Cooperative Coding and Diversity Technology Based on Polar Code," Thesis Submitted to Nanjing University of Posts and Telecommunications for the Degree of Master of Engineering (Mar. 2013).
Samsung, "NR-PBCH contents and payload size," 3GPP TSG WG1 NR Ad-Hoc#2, R1-1710627, Qingdao, P.R. China (Jun. 27-30, 2017).
Trifonav et al., "Polar codes with dynamic frozen symbols and their decoding by directed search," IEEE Information Theory Workshop (Sep. 9-13, 2013).
Third Generation Partnership Project, "Technical Specification Group Radio Access Network; NR Multiplexing and channel coding (Release 15)," 3GPP TS 38.212 V1.0.0 (Sep. 2017).
Third Generation Partnership Project, "Technical Specification Group Radio Access Network; NR Physical layer procedures for control (Release 15)," 3GPP TS 38.213 V1.0.0 (Sep. 2017).
Third Generation Partnership Project, "Technical Specification Group Radio Access Network; NR Physical channels and modulation (Release 15)," 3GPP TS 38.211 V1.0.0 (Sep. 2017).
Third Generation Partnership Project, "Technical Specification Group Radio Access Network; NR; Radio Resource Control (RRC); Protocol specification (Release 15)," 3GPP TS 38.331 V0.0.5 (Aug. 2017).
Third Generation Partnership Project, "Technical Specification Group Radio Access Network; NR; NR and NG-RAN Overall Description; Stage 2 (Release 15)," 3GPP TS 38.300 V1.0.0 (Sep. 2017).
Third Generation Partnership Project, "Technical Specification Group Radio Access Network; Study on New Radio (NR) Access Technology; Physical Layer Aspects (Release 14)," 3GPP TR 38 802 V0.1.0 (Aug. 2016).

(56) References Cited

OTHER PUBLICATIONS

Third Generation Partnership Project, "Technical Specification Group Radio Access Network; Study on New Radio Access Technology Physical Layer Aspects (Release 14)," 3GPP TR 38.802 V14.2.0 (Sep. 2017).
Third Generation Partnership Project, "Technical Technical Specification Group Radio Access Network Evolved Universal Terrestrial Radio Access (E-UTRA); Physical channels and modulation (Release 13)," 3GPP TS 36.211 V13.2.0 (Jun. 2016).
Third Generation Partnership Project, "Technical Specification Group Radio Access Network; Evolved Universal Terrestrial Radio Access (E-UTRA); Physical channels and modulation (Release 13)," 3GPP TS 36.211V13.7.1 (Sep. 2017).
Third Generation Partnership Project, "Technical Specification Group Radio Access Network; Evolved Universal Terrestrial Radio Access (E-UTRA); Physical channels and modulation (Release 14)," 3GPP TS 36.211 V14.4.0 (Sep. 2017).
Third Generation Partnership Project, "Technical Specification Group Radio Access Network; Evolved Universal Terrestrial Radio Access (E-UTRA); Multiplexing and channel coding (Release 13)," 3GPP TS 36.212 V13.2.0 (Jun. 2016).
Third Generation Partnership Project, "Technical Specification Group Radio Access Network; Evolved Universal Terrestrial Radio Access (E-UTRA); Multiplexing and channel coding (Release 13)," 3GPP TS 36.212 V13.6.0 (Jun. 2017).
Third Generation Partnership Project, "Technical Specification Group Radio Access Network; Evolved Universal Terrestrial Radio Access (E-UTRA); Multiplexing and channel coding (Release 14)," 3GPP TS 36.212 V14.4.0 (Sep. 2017).
Third Generation Partnership Project, "Technical Specification Group Radio Access Network; Evolved Universal Terrestrial Radio Access (E-UTRA); Physical layer procedures (Release 13)," 3GPP TS 36.213 V13.2.0 (Jun. 2016).
Third Generation Partnership Project, "Technical Specification Group Radio Access Network; Evolved Jniversal Terrestrial Radio Access (E-UTRA); Physical layer procedures (Release 13)," 3GPP TS 36.213 V13.7.0 (Sep. 2017).
Third Generation Partnership Project, "Technical Specification Group Radio Access Network; Evolved Jniversal Terrestrial Radio Access (E-UTRA); Physical layer procedures (Release 14)," 3GPP TS 36.213 V14.4.0 (Sep. 2017).
Third Generation Partnership Project, "Technical Specification Group Radio Access Network; Evolved Universal Terrestrial Radio Access (E-UTRA) and Evolved Universal Terrestrial Radio Access Network (E-UTRAN) Overall description; Stage 2 (Release 13)" 3GPP TS 36.300 V13.4.0 (Jun. 2016).
Fhird Generation Partnership Project, "Technical Specification Group Radio Access Network; Evolved Universal Terrestrial Radio Access (E-UTRA) and Evolved Universal Terrestrial Radio Access Network (EUTRAN) Overall description; Stage 2 (Release 13)," 3GPP Ts 36.300 V13.9.0 (Sep. 2017).
Fhird Generation Partnership Project, "Technical Specification Group Radio Access Network; Evolved Universal Terrestrial Radio Access (E-UTRA) and Evolved Universal Terrestrial Radio Access Network (E-UTRAN) Overall description; Stage 2 (Release 14)," 3GPP Ts 36.300 V14.4.0 (Sep. 2017).
Fhird Generation Partnership Project, "Technical Specification Group Radio Access Network; Evolved Universal Terrestrial Radio Access (E-UTRA); Radio Resource Control (RRC); Protocol specification (Release 13)," 3GPP Ts 36.331 V13.2.0 (Jun. 2016).
Fhird Generation Partnership Project, "Technical Specification Group Radio Access Network; Evolved Universal Terrestrial Radio Access (E-UTRA); Radio Resource Control (RRC); Protocol specification (Release 13)," 3GPPTS 36.331 V13.6.1 (Jul. 2017).
Fhird Generation Partnership Project, "Technical Specification Group Radio Access Network; Evolved Universal Terrestrial Radio Access (E-UTRA); Radio Resource Control (RRC); Protocol specification (Release 14)," 3GPP Ts 36.331 V14.4.0 (Sep. 2017).
Fhird Generation Partnership Project, "Technical Specification Group Radio Access Network; NR Services provided by the physical layer (Release 15)," 3GPP Ts 38.202 V1.0.0 (Sep. 2017).

\* cited by examiner

EFFICIENT BROADCAST CHANNEL IN BEAMFORMED SYSTEMS FOR NR

CROSS REFERENCE TO RELATED APPLICATIONS

This application is the U.S. National Stage, under 35 U.S.C. § 371, of International Application No. PCT/US2017/054160 filed Sep. 28, 2017, which claims the benefit of U.S. Provisional Application Ser. No. 62/401,024 filed Sep. 28, 2016, U.S. Provisional Application Ser. No. 62/416,615 filed Nov. 2, 2016, and U.S. Provisional Application Ser. No. 62/454,491 filed Feb. 3, 2017, the contents of which are hereby incorporated by reference herein.

BACKGROUND

Based on the general requirements set out by the International Telecommunication Union Radiocommunication Sector (ITU-R), the Next Generation Mobile Networks (NGMN) Alliance, and the 3rd Generation Partnership Project (3GPP), a broad classification of use cases for emerging Fifth Generation (5G) New Radio (NR) systems may include Enhanced Mobile Broadband (eMBB), Massive Machine Type Communications (mMTC), and Ultra Reliable and Low latency Communications (URLLC). Different use cases may focus on different requirements such as higher data rate, higher spectrum efficiency, low power and higher energy efficiency, lower latency and higher reliability. A wide range of spectrum bands ranging from 700 MHz to 80 GHz are being considered for a variety of deployment scenarios.

SUMMARY

Disclosed herein are systems, apparatuses, and methods for transmitting a physical broadcast channel (PBCH) in beamforming systems in new radio (NR) 5th Generation (5G) wireless networks. Embodiments may include reducing beam sweep overhead and energy/power savings for transmission of the PBCH. Embodiments may include efficiently transmitting system information using the PBCH transmissions. Embodiments may include enhancing PBCH performance since information bits carried by PBCH is important.

Embodiments may include a method of improving the efficiency of physical broadcast channel (PBCH) transmission in a wireless system. The method may include: determining a PBCH beam hopping pattern and transmitting the PBCH based on the PBCH beam hopping pattern. The method may also include: determining a direction distribution pattern of wireless transmit receive units (WTRU); adjusting the PBCH beam hopping pattern based on the direction distribution pattern; and adjusting the PBCH transmission with a different beam sweeping frequency based on the direction distribution pattern.

A method for use in a transmission/reception point (TRP) for transmitting system information on a PBCH is described herein. The TRP may generate a concatenated master information block (MIB) transport block that includes information bits associated with system bandwidth information, timing information, system frame number (SFN), a beam sweeping configuration, and a control resource set (CORESET). The TRP may then attach at least 16 cyclic redundancy check (CRC) bits to the concatenated MIB, wherein the at least 16 CRC bits include bits for data detection and error correction. The TRP may then prioritize the concatenated MIB and the at least 16 CRC bits based on content associated with the concatenated MIB and the at least 16 CRC bits. The TRP may then perform channel coding of the prioritized concatenated MIB and the at least 16 CRC bits to produce coded bits using at least one polar encoder of a plurality of polar encoders each with a coding rate that is less than ⅓. The TRP may then perform rate matching via repetition on the coded bits and then may transmit the rate matched, coded bits on the PBCH of a radio frame.

BRIEF DESCRIPTION OF THE DRAWINGS

A more detailed understanding may be had from the following description, given by way of example in conjunction with the accompanying drawings, wherein like reference numerals in the figures indicate like elements, and wherein:

FIG. 10 is a diagram illustrating a beam-centric PBCH transmission;

DETAILED DESCRIPTION

Figure 1A:
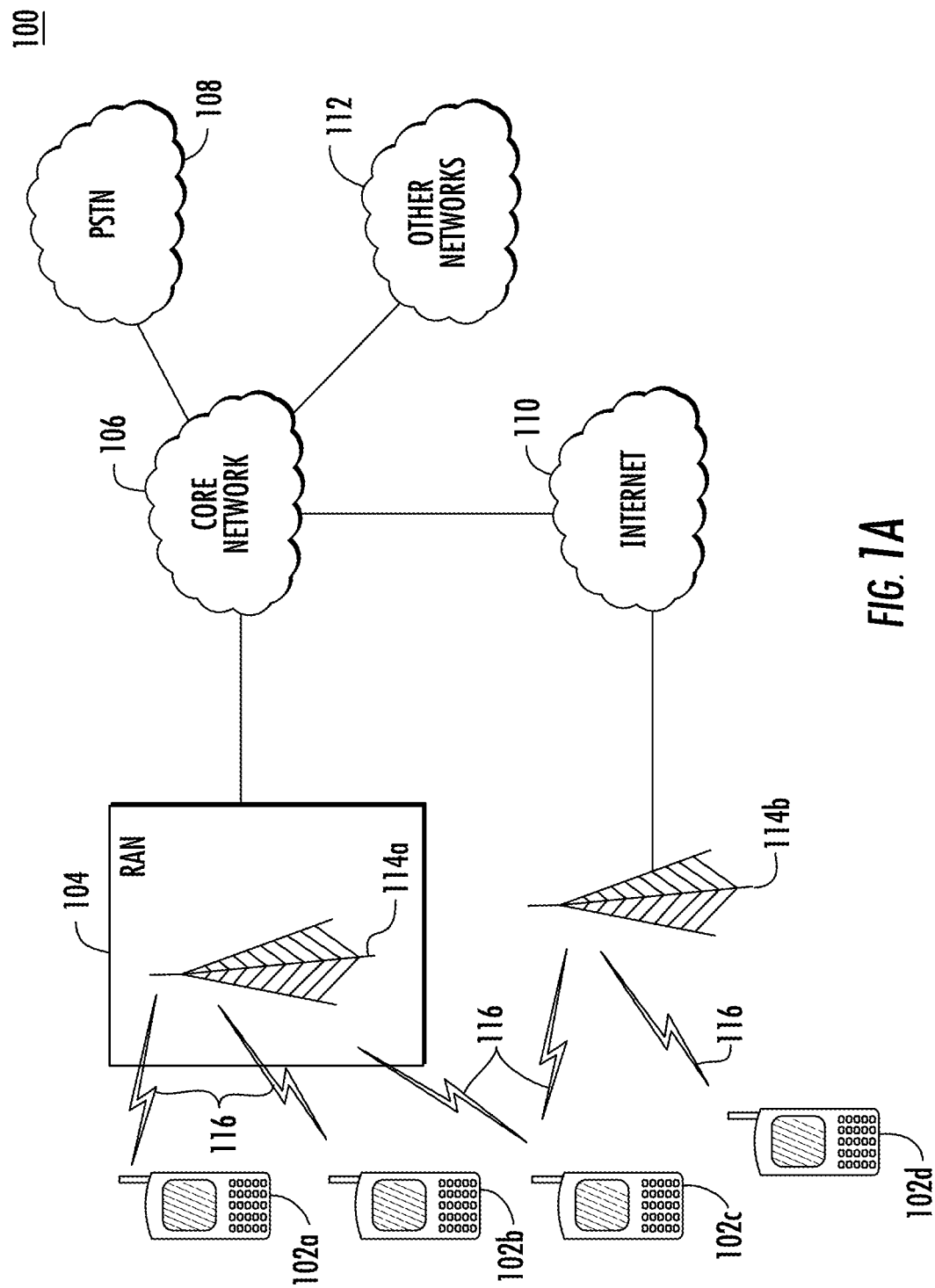
FIG. 1A is a system diagram illustrating an example communications system in which one or more disclosed embodiments may be implemented.

FIG. 1A is a diagram illustrating an example communications system 100 in which one or more disclosed embodiments may be implemented. The communications system 100 may be a multiple access system that provides content, such as voice, data, video, messaging, broadcast, etc., to multiple wireless users. The communications system 100 may enable multiple wireless users to access such content through the sharing of system resources, including wireless bandwidth. For example, the communications systems 100 may employ one or more channel access methods, such as code division multiple access (CDMA), time division multiple access (TDMA), frequency division multiple access (FDMA), orthogonal FDMA (OFDMA), single-carrier FDMA (SC-FDMA), zero-tail unique-word discrete Fourier transform Spread OFDM (ZT-UW-DFT-S-OFDM), unique word OFDM (UW-OFDM), resource block-filtered OFDM, filter bank multicarrier (FBMC), and the like.

As shown in FIG. 1A, the communications system 100 may include wireless transmit/receive units (WTRUs) 102a, 102b, 102c, 102d, a radio access network (RAN) 104, a core network (CN) 106, a public switched telephone network (PSTN) 108, the Internet 110, and other networks 112, though it will be appreciated that the disclosed embodiments contemplate any number of WTRUs, base stations, networks, and/or network elements. Each of the WTRUs 102a, 102b, 102c, 102d may be any type of device configured to operate and/or communicate in a wireless environment. By way of example, the WTRUs 102a, 102b, 102c, 102d, any of which may be referred to as a station (STA), may be configured to transmit and/or receive wireless signals and may include a user equipment (UE), a mobile station, a fixed or mobile subscriber unit, a subscription-based unit, a pager, a cellular telephone, a personal digital assistant (PDA), a smartphone, a laptop, a netbook, a personal computer, a wireless sensor, a hotspot or Mi-Fi device, an Internet of Things (IoT) device, a watch or other wearable, a head-mounted display (HMD), a vehicle, a drone, a medical device and applications (e.g., remote surgery), an industrial device and applications (e.g., a robot and/or other wireless devices operating in an industrial and/or an automated processing chain contexts), a consumer electronics device, a device operating on commercial and/or industrial wireless networks, and the like. Any of the WTRUs 102a, 102b, 102c and 102d may be interchangeably referred to as a UE.

The communications systems 100 may also include a base station 114a and/or a base station 114b. Each of the base stations 114a, 114b may be any type of device configured to wirelessly interface with at least one of the WTRUs 102a, 102b, 102c, 102d to facilitate access to one or more communication networks, such as the CN 106, the Internet 110, and/or the other networks 112. By way of example, the base stations 114a, 114b may be a base transceiver station (BTS), a NodeB, an eNode B (eNB), a Home Node B, a Home eNode B, a next generation NodeB, such as a gNode B (gNB), a new radio (NR) NodeB, a site controller, an access point (AP), a wireless router, a transmission/reception point (TRP), and the like. While the base stations 114a, 114b are each depicted as a single element, it will be appreciated that the base stations 114a, 114b may include any number of interconnected base stations and/or network elements.

The base station 114a may be part of the RAN 104, which may also include other base stations and/or network elements (not shown), such as a base station controller (BSC), a radio network controller (RNC), relay nodes, and the like. The base station 114a and/or the base station 114b may be configured to transmit and/or receive wireless signals on one or more carrier frequencies, which may be referred to as a cell (not shown). These frequencies may be in licensed spectrum, unlicensed spectrum, or a combination of licensed and unlicensed spectrum. A cell may provide coverage for a wireless service to a specific geographical area that may be relatively fixed or that may change over time. The cell may further be divided into cell sectors. For example, the cell associated with the base station 114a may be divided into three sectors. Thus, in one embodiment, the base station 114a may include three transceivers, i.e., one for each sector of the cell. In an embodiment, the base station 114a may employ multiple-input multiple output (MIMO) technology and may utilize multiple transceivers for each sector of the cell. For example, beamforming may be used to transmit and/or receive signals in desired spatial directions.

The base stations 114a, 114b may communicate with one or more of the WTRUs 102a, 102b, 102c, 102d over an air interface 116, which may be any suitable wireless communication link (e.g., radio frequency (RF), microwave, centimeter wave, micrometer wave, infrared (IR), ultraviolet (UV), visible light, etc.). The air interface 116 may be established using any suitable radio access technology (RAT).

More specifically, as noted above, the communications system 100 may be a multiple access system and may employ one or more channel access schemes, such as CDMA, TDMA, FDMA, OFDMA, SC-FDMA, and the like. For example, the base station 114a in the RAN 104 and the WTRUs 102a, 102b, 102c may implement a radio technology such as Universal Mobile Telecommunications System (UMTS) Terrestrial Radio Access (UTRA), which may establish the air interface 116 using wideband CDMA (WCDMA). WCDMA may include communication protocols such as High-Speed Packet Access (HSPA) and/or Evolved HSPA (HSPA+). HSPA may include High-Speed Downlink (DL) Packet Access (HSDPA) and/or High-Speed Uplink (UL) Packet Access (HSUPA).

In an embodiment, the base station 114a and the WTRUs 102a, 102b, 102c may implement a radio technology such as Evolved UMTS Terrestrial Radio Access (E-UTRA), which may establish the air interface 116 using Long Term Evolution (LTE) and/or LTE-Advanced (LTE-A) and/or LTE-Advanced Pro (LTE-A Pro).

In an embodiment, the base station 114a and the WTRUs 102a, 102b, 102c may implement a radio technology such as NR Radio Access, which may establish the air interface 116 using NR.

In an embodiment, the base station 114a and the WTRUs 102a, 102b, 102c may implement multiple radio access technologies. For example, the base station 114a and the WTRUs 102a, 102b, 102c may implement LTE radio access and NR radio access together, for instance using dual connectivity (DC) principles. Thus, the air interface utilized by WTRUs 102a, 102b, 102c may be characterized by multiple types of radio access technologies and/or transmissions sent to/from multiple types of base stations (e.g., an eNB and a gNB).

In other embodiments, the base station 114a and the WTRUs 102a, 102b, 102c may implement radio technologies such as IEEE 802.11 (i.e., Wireless Fidelity (WiFi), IEEE 802.16 (i.e., Worldwide Interoperability for Microwave Access (WiMAX)), CDMA2000, CDMA2000 1×, CDMA2000 EV-DO, Interim Standard 2000 (IS-2000), Interim Standard 95 (IS-95), Interim Standard 856 (IS-856), Global System for Mobile communications (GSM), Enhanced Data rates for GSM Evolution (EDGE), GSM EDGE (GERAN), and the like.

The base station 114b in FIG. 1A may be a wireless router, Home Node B, Home eNode B, or access point, for example, and may utilize any suitable RAT for facilitating wireless connectivity in a localized area, such as a place of business, a home, a vehicle, a campus, an industrial facility, an air corridor (e.g., for use by drones), a roadway, and the like. In one embodiment, the base station 114b and the WTRUs 102c, 102d may implement a radio technology such as IEEE 802.11 to establish a wireless local area network (WLAN). In an embodiment, the base station 114b and the WTRUs 102c, 102d may implement a radio technology such as IEEE 802.15 to establish a wireless personal area network (WPAN). In yet another embodiment, the base station 114b and the WTRUs 102c, 102d may utilize a cellular-based RAT (e.g., WCDMA, CDMA2000, GSM, LTE, LTE-A, LTE-A Pro, NR etc.) to establish a picocell or femtocell. As shown in FIG. 1A, the base station 114b may have a direct connection to the Internet 110. Thus, the base station 114b may not be required to access the Internet 110 via the CN 106.

The RAN 104 may be in communication with the CN 106, which may be any type of network configured to provide voice, data, applications, and/or voice over internet protocol (VoIP) services to one or more of the WTRUs 102a, 102b, 102c, 102d. The data may have varying quality of service (QoS) requirements, such as differing throughput requirements, latency requirements, error tolerance requirements, reliability requirements, data throughput requirements, mobility requirements, and the like. The CN 106 may provide call control, billing services, mobile location-based services, pre-paid calling, Internet connectivity, video distribution, etc., and/or perform high-level security functions, such as user authentication. Although not shown in FIG. 1A, it will be appreciated that the RAN 104 and/or the CN 106 may be in direct or indirect communication with other RANs that employ the same RAT as the RAN 104 or a different RAT. For example, in addition to being connected to the RAN 104, which may be utilizing a NR radio technology, the CN 106 may also be in communication with another RAN (not shown) employing a GSM, UMTS, CDMA 2000, WiMAX, E-UTRA, or WiFi radio technology.

The CN 106 may also serve as a gateway for the WTRUs 102a, 102b, 102c, 102d to access the PSTN 108, the Internet 110, and/or the other networks 112. The PSTN 108 may include circuit-switched telephone networks that provide plain old telephone service (POTS). The Internet 110 may include a global system of interconnected computer networks and devices that use common communication protocols, such as the transmission control protocol (TCP), user datagram protocol (UDP) and/or the internet protocol (IP) in the TCP/IP internet protocol suite. The networks 112 may include wired and/or wireless communications networks owned and/or operated by other service providers. For example, the networks 112 may include another CN connected to one or more RANs, which may employ the same RAT as the RAN 104 or a different RAT.

Some or all of the WTRUs 102a, 102b, 102c, 102d in the communications system 100 may include multi-mode capabilities (e.g., the WTRUs 102a, 102b, 102c, 102d may include multiple transceivers for communicating with different wireless networks over different wireless links). For example, the WTRU 102c shown in FIG. 1A may be configured to communicate with the base station 114a, which may employ a cellular-based radio technology, and with the base station 114b, which may employ an IEEE 802 radio technology.

Figure 1B:
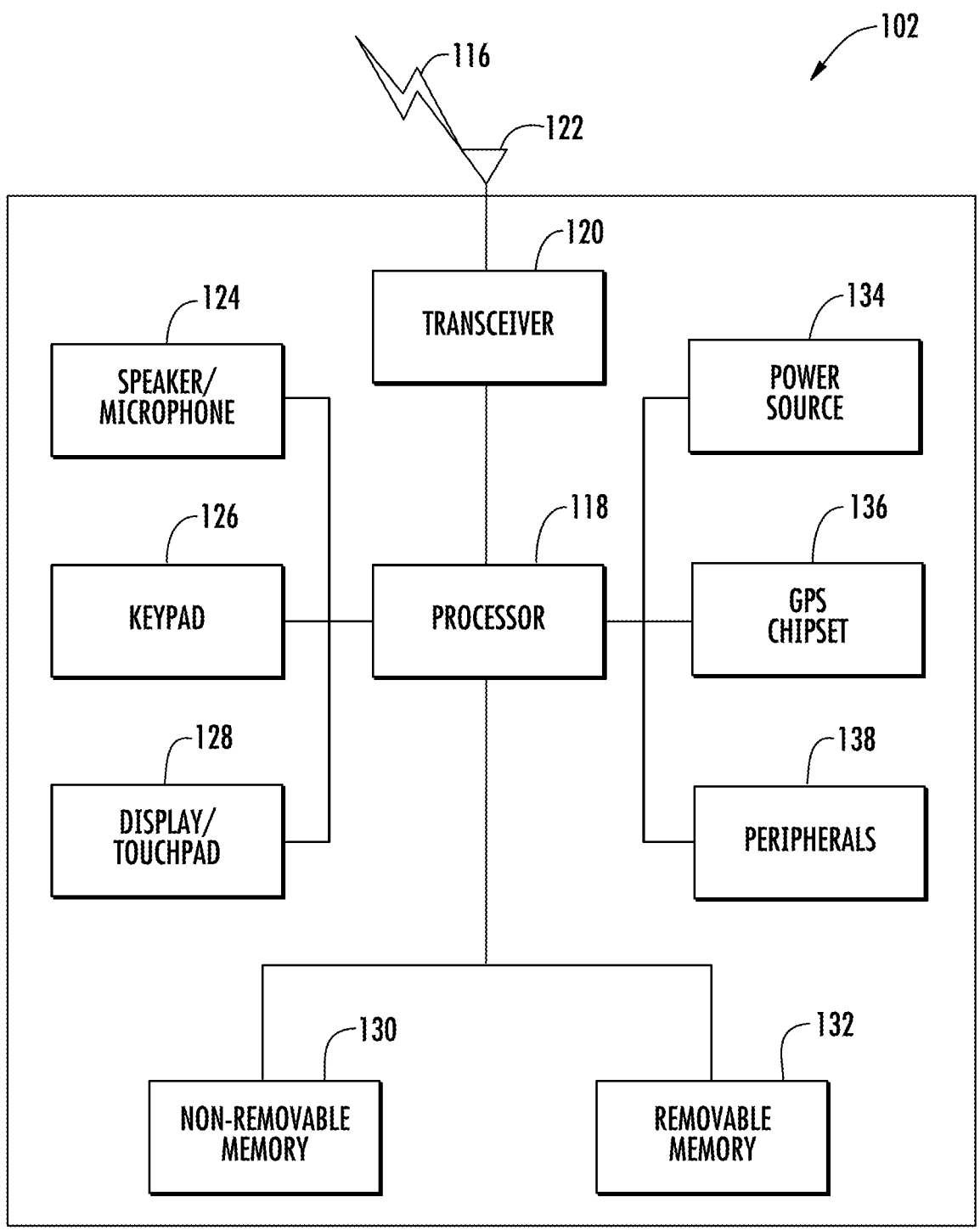
FIG. 1B is a system diagram illustrating an example wireless transmit/receive unit (WTRU) that may be used within the communications system illustrated in FIG. 1A according to an embodiment.
Figure 1C:
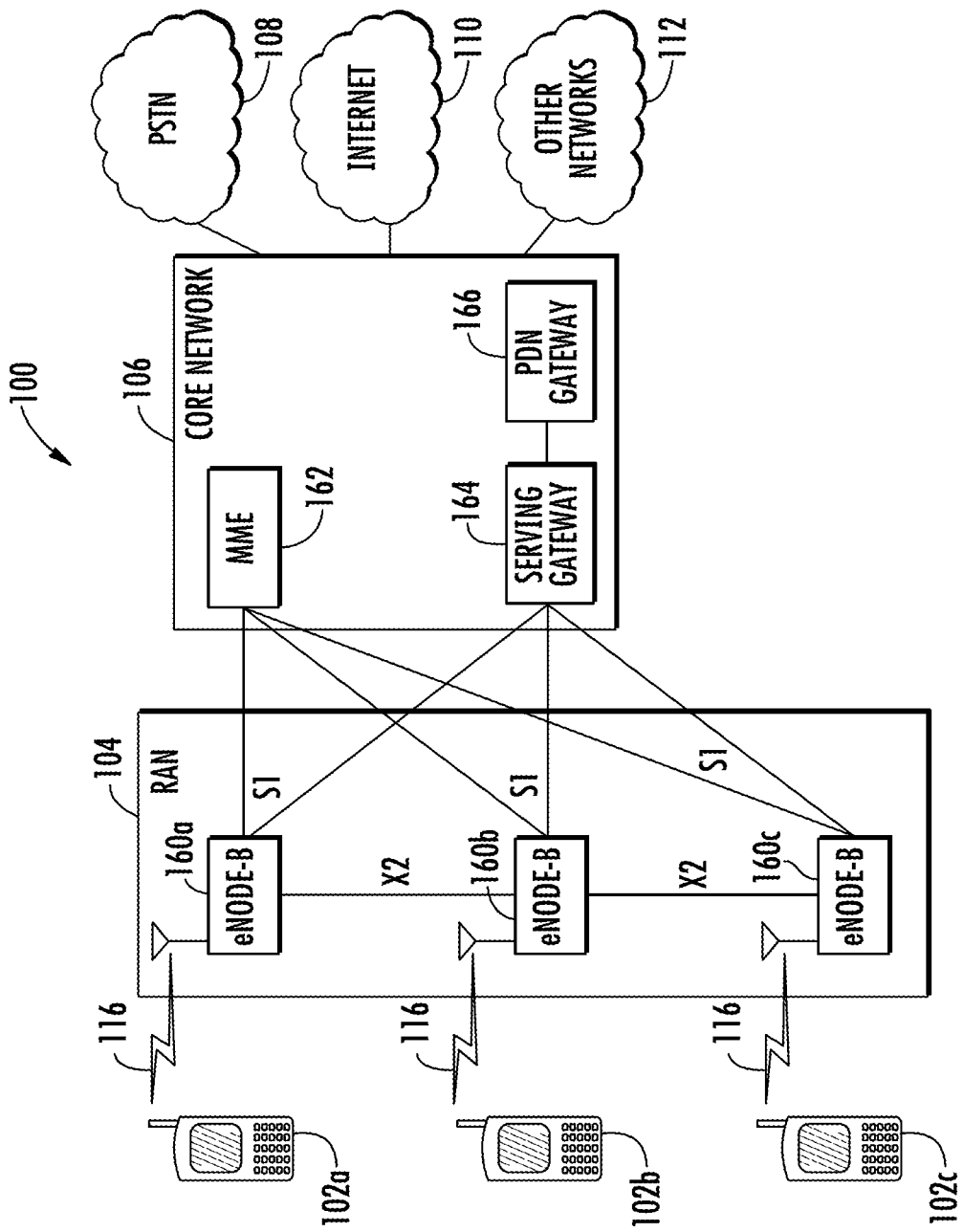
FIG. 1D is a system diagram illustrating a further example RAN and a further example CN that may be used within the communications system illustrated in FIG. 1A according to an embodiment.

FIG. 1B is a system diagram illustrating an example WTRU 102. As shown in FIG. 1B, the WTRU 102 may include a processor 118, a transceiver 120, a transmit/receive element 122, a speaker/microphone 124, a keypad 126, a display/touchpad 128, non-removable memory 130, removable memory 132, a power source 134, a global positioning system (GPS) chipset 136, and/or other peripherals 138, among others. It will be appreciated that the WTRU 102 may include any sub-combination of the foregoing elements while remaining consistent with an embodiment.

The processor 118 may be a general purpose processor, a special purpose processor, a conventional processor, a digital signal processor (DSP), a plurality of microprocessors, one or more microprocessors in association with a DSP core, a controller, a microcontroller, Application Specific Integrated Circuits (ASICs), Field Programmable Gate Arrays (FPGAs), any other type of integrated circuit (IC), a state machine, and the like. The processor 118 may perform signal coding, data processing, power control, input/output processing, and/or any other functionality that enables the WTRU 102 to operate in a wireless environment. The processor 118 may be coupled to the transceiver 120, which may be coupled to the transmit/receive element 122. While FIG. 1B depicts the processor 118 and the transceiver 120 as separate components, it will be appreciated that the processor 118 and the transceiver 120 may be integrated together in an electronic package or chip.

The transmit/receive element 122 may be configured to transmit signals to, or receive signals from, a base station (e.g., the base station 114a) over the air interface 116. For example, in one embodiment, the transmit/receive element 122 may be an antenna configured to transmit and/or receive RF signals. In an embodiment, the transmit/receive element 122 may be an emitter/detector configured to transmit and/or receive IR, UV, or visible light signals, for example. In yet another embodiment, the transmit/receive element 122 may be configured to transmit and/or receive both RF and light signals. It will be appreciated that the transmit/receive element 122 may be configured to transmit and/or receive any combination of wireless signals.

Although the transmit/receive element 122 is depicted in FIG. 1B as a single element, the WTRU 102 may include any number of transmit/receive elements 122. More specifically, the WTRU 102 may employ MIMO technology. Thus, in one embodiment, the WTRU 102 may include two or more transmit/receive elements 122 (e.g., multiple antennas) for transmitting and receiving wireless signals over the air interface 116.

The transceiver 120 may be configured to modulate the signals that are to be transmitted by the transmit/receive element 122 and to demodulate the signals that are received by the transmit/receive element 122. As noted above, the WTRU 102 may have multi-mode capabilities. Thus, the transceiver 120 may include multiple transceivers for enabling the WTRU 102 to communicate via multiple RATs, such as NR and IEEE 802.11, for example.

The processor 118 of the WTRU 102 may be coupled to, and may receive user input data from, the speaker/microphone 124, the keypad 126, and/or the display/touchpad 128 (e.g., a liquid crystal display (LCD) display unit or organic light-emitting diode (OLED) display unit). The processor 118 may also output user data to the speaker/microphone 124, the keypad 126, and/or the display/touchpad 128. In addition, the processor 118 may access information from, and store data in, any type of suitable memory, such as the non-removable memory 130 and/or the removable memory 132. The non-removable memory 130 may include random-access memory (RAM), read-only memory (ROM), a hard disk, or any other type of memory storage device. The removable memory 132 may include a subscriber identity module (SIM) card, a memory stick, a secure digital (SD) memory card, and the like. In other embodiments, the processor 118 may access information from, and store data in, memory that is not physically located on the WTRU 102, such as on a server or a home computer (not shown).

The processor 118 may receive power from the power source 134, and may be configured to distribute and/or control the power to the other components in the WTRU 102. The power source 134 may be any suitable device for powering the WTRU 102. For example, the power source 134 may include one or more dry cell batteries (e.g., nickel-cadmium (NiCd), nickel-zinc (NiZn), nickel metal hydride (NiMH), lithium-ion (Li-ion), etc.), solar cells, fuel cells, and the like.

The processor 118 may also be coupled to the GPS chipset 136, which may be configured to provide location information (e.g., longitude and latitude) regarding the current location of the WTRU 102. In addition to, or in lieu of, the information from the GPS chipset 136, the WTRU 102 may receive location information over the air interface 116 from a base station (e.g., base stations 114a, 114b) and/or determine its location based on the timing of the signals being received from two or more nearby base stations. It will be appreciated that the WTRU 102 may acquire location information by way of any suitable location-determination method while remaining consistent with an embodiment.

The processor 118 may further be coupled to other peripherals 138, which may include one or more software and/or hardware modules that provide additional features, functionality and/or wired or wireless connectivity. For example, the peripherals 138 may include an accelerometer, an e-compass, a satellite transceiver, a digital camera (for photographs and/or video), a universal serial bus (USB) port, a vibration device, a television transceiver, a hands free headset, a Bluetooth® module, a frequency modulated (FM) radio unit, a digital music player, a media player, a video game player module, an Internet browser, a Virtual Reality and/or Augmented Reality (VR/AR) device, an activity tracker, and the like. The peripherals 138 may include one or more sensors. The sensors may be one or more of a gyroscope, an accelerometer, a hall effect sensor, a magnetometer, an orientation sensor, a proximity sensor, a temperature sensor, a time sensor; a geolocation sensor, an altimeter, a light sensor, a touch sensor, a magnetometer, a barometer, a gesture sensor, a biometric sensor, a humidity sensor and the like.

The WTRU 102 may include a full duplex radio for which transmission and reception of some or all of the signals (e.g., associated with particular subframes for both the UL (e.g., for transmission) and DL (e.g., for reception) may be concurrent and/or simultaneous. The full duplex radio may include an interference management unit to reduce and or substantially eliminate self-interference via either hardware (e.g., a choke) or signal processing via a processor (e.g., a separate processor (not shown) or via processor 118). In an embodiment, the WTRU 102 may include a half-duplex radio for which transmission and reception of some or all of the signals (e.g., associated with particular subframes for either the UL (e.g., for transmission) or the DL (e.g., for reception)).

Figure 10:
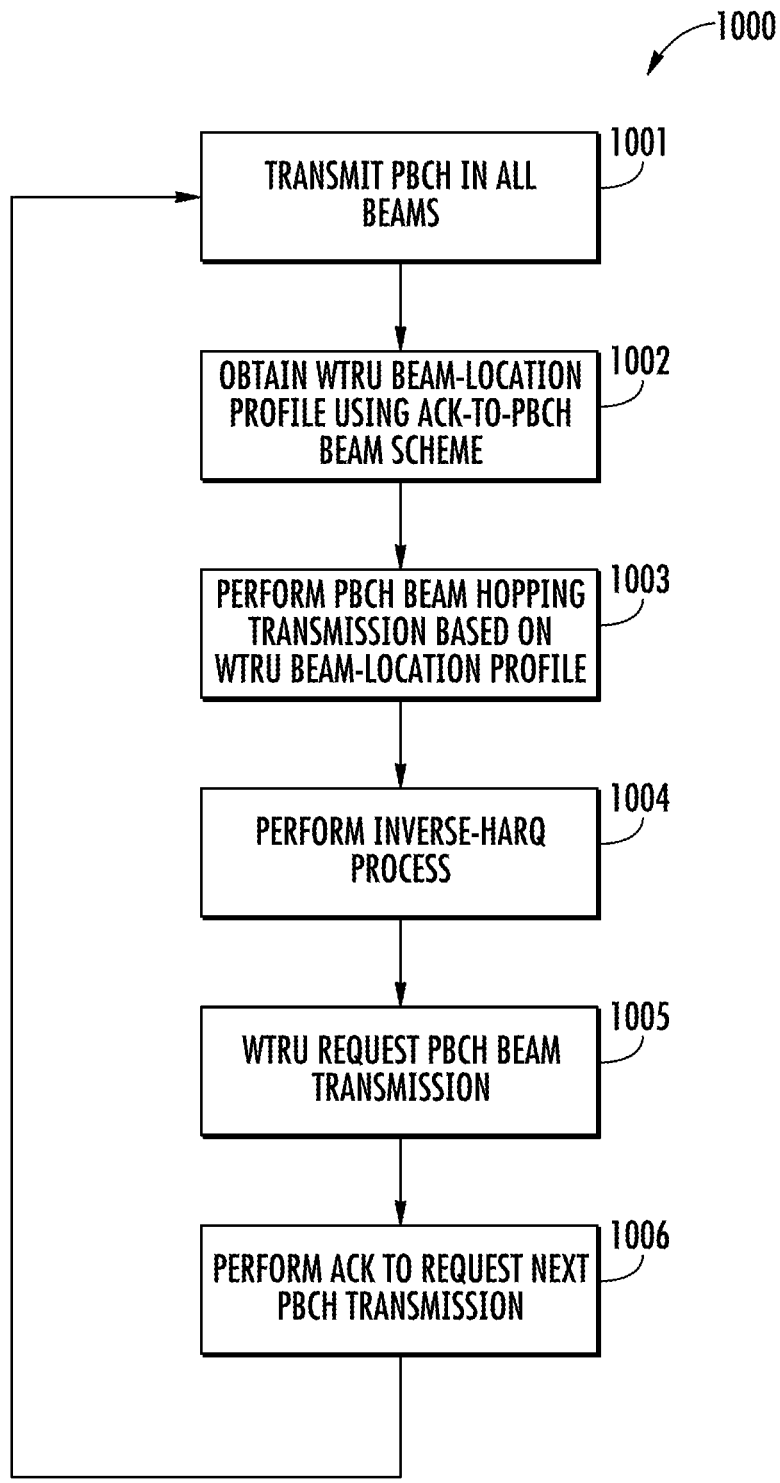
FIG. 10 is a system diagram illustrating an example radio access network (RAN) and an example core network (CN) that may be used within the communications system illustrated in FIG. 1A according to an embodiment.

FIG. 10 is a system diagram illustrating the RAN 104 and the CN 106 according to an embodiment. As noted above, the RAN 104 may employ an E-UTRA radio technology to communicate with the WTRUs 102a, 102b, 102c over the air interface 116. The RAN 104 may also be in communication with the CN 106.

The RAN 104 may include eNode-Bs 160a, 160b, 160c, though it will be appreciated that the RAN 104 may include any number of eNode-Bs while remaining consistent with an embodiment. The eNode-Bs 160a, 160b, 160c may each include one or more transceivers for communicating with the WTRUs 102a, 102b, 102c over the air interface 116. In one embodiment, the eNode-Bs 160a, 160b, 160c may implement MIMO technology. Thus, the eNode-B 160a, for example, may use multiple antennas to transmit wireless signals to, and/or receive wireless signals from, the WTRU 102a.

Each of the eNode-Bs 160a, 160b, 160c may be associated with a particular cell (not shown) and may be configured to handle radio resource management decisions, handover decisions, scheduling of users in the UL and/or DL, and the like. As shown in FIG. 10, the eNode-Bs 160a, 160b, 160c may communicate with one another over an X2 interface.

The CN 106 shown in FIG. 10 may include a mobility management entity (MME) 162, a serving gateway (SGW) 164, and a packet data network (PDN) gateway (PGW) 166. While the foregoing elements are depicted as part of the CN 106, it will be appreciated that any of these elements may be owned and/or operated by an entity other than the CN operator.

The MME 162 may be connected to each of the eNode-Bs 162a, 162b, 162c in the RAN 104 via an S1 interface and may serve as a control node. For example, the MME 162 may be responsible for authenticating users of the WTRUs 102a, 102b, 102c, bearer activation/deactivation, selecting a particular serving gateway during an initial attach of the WTRUs 102a, 102b, 102c, and the like. The MME 162 may provide a control plane function for switching between the RAN 104 and other RANs (not shown) that employ other radio technologies, such as GSM and/or WCDMA.

The SGW 164 may be connected to each of the eNode Bs 160a, 160b, 160c in the RAN 104 via the S1 interface. The SGW 164 may generally route and forward user data packets to/from the WTRUs 102a, 102b, 102c. The SGW 164 may perform other functions, such as anchoring user planes during inter-eNode B handovers, triggering paging when DL data is available for the WTRUs 102a, 102b, 102c, managing and storing contexts of the WTRUs 102a, 102b, 102c, and the like.

The SGW 164 may be connected to the PGW 166, which may provide the WTRUs 102a, 102b, 102c with access to packet-switched networks, such as the Internet 110, to facilitate communications between the WTRUs 102a, 102b, 102c and IP-enabled devices.

The CN 106 may facilitate communications with other networks. For example, the CN 106 may provide the WTRUs 102a, 102b, 102c with access to circuit-switched networks, such as the PSTN 108, to facilitate communications between the WTRUs 102a, 102b, 102c and traditional land-line communications devices. For example, the CN 106 may include, or may communicate with, an IP gateway (e.g., an IP multimedia subsystem (IMS) server) that serves as an interface between the CN 106 and the PSTN 108. In addition, the CN 106 may provide the WTRUs 102a, 102b, 102c with access to the other networks 112, which may include other wired and/or wireless networks that are owned and/or operated by other service providers.

Although the WTRU is described in FIGS. 1A-1D as a wireless terminal, it is contemplated that in certain representative embodiments that such a terminal may use (e.g., temporarily or permanently) wired communication interfaces with the communication network.

In representative embodiments, the other network 112 may be a WLAN.

A WLAN in Infrastructure Basic Service Set (BSS) mode may have an Access Point (AP) for the BSS and one or more stations (STAs) associated with the AP. The AP may have access or an interface to a Distribution System (DS) or another type of wired/wireless network that carries traffic in to and/or out of the BSS. Traffic to STAs that originates from outside the BSS may arrive through the AP and may be delivered to the STAs. Traffic originating from STAs to destinations outside the BSS may be sent to the AP to be delivered to respective destinations. Traffic between STAs within the BSS may be sent through the AP, for example, where the source STA may send traffic to the AP and the AP may deliver the traffic to the destination STA. The traffic between STAs within a BSS may be considered and/or referred to as peer-to-peer traffic. The peer-to-peer traffic may be sent between (e.g., directly between) the source and destination STAs with a direct link setup (DLS). In certain representative embodiments, the DLS may use an 802.11e DLS or an 802.11z tunneled DLS (TDLS). A WLAN using an Independent BSS (IBSS) mode may not have an AP, and the STAs (e.g., all of the STAs) within or using the IBSS may communicate directly with each other. The IBSS mode of communication may sometimes be referred to herein as an "ad-hoc" mode of communication.

When using the 802.11ac infrastructure mode of operation or a similar mode of operations, the AP may transmit a beacon on a fixed channel, such as a primary channel. The primary channel may be a fixed width (e.g., 20 MHz wide bandwidth) or a dynamically set width. The primary channel may be the operating channel of the BSS and may be used by the STAs to establish a connection with the AP. In certain representative embodiments, Carrier Sense Multiple Access with Collision Avoidance (CSMA/CA) may be implemented, for example in 802.11 systems. For CSMA/CA, the STAs (e.g., every STA), including the AP, may sense the primary channel. If the primary channel is sensed/detected and/or determined to be busy by a particular STA, the particular STA may back off. One STA (e.g., only one station) may transmit at any given time in a given BSS.

High Throughput (HT) STAs may use a 40 MHz wide channel for communication, for example, via a combination of the primary 20 MHz channel with an adjacent or nonadjacent 20 MHz channel to form a 40 MHz wide channel.

Very High Throughput (VHT) STAs may support 20 MHz, 40 MHz, 80 MHz, and/or 160 MHz wide channels. The 40 MHz, and/or 80 MHz, channels may be formed by combining contiguous 20 MHz channels. A 160 MHz channel may be formed by combining 8 contiguous 20 MHz channels, or by combining two non-contiguous 80 MHz channels, which may be referred to as an 80+80 configuration. For the 80+80 configuration, the data, after channel encoding, may be passed through a segment parser that may divide the data into two streams. Inverse Fast Fourier Transform (IFFT) processing, and time domain processing, may be done on each stream separately. The streams may be mapped on to the two 80 MHz channels, and the data may be transmitted by a transmitting STA. At the receiver of the receiving STA, the above described operation for the 80+80 configuration may be reversed, and the combined data may be sent to the Medium Access Control (MAC).

Sub 1 GHz modes of operation are supported by 802.11af and 802.11ah. The channel operating bandwidths, and carriers, are reduced in 802.11af and 802.11ah relative to those used in 802.11n, and 802.11ac. 802.11af supports 5 MHz, 10 MHz, and 20 MHz bandwidths in the TV White Space (TVWS) spectrum, and 802.11ah supports 1 MHz, 2 MHz, 4 MHz, 8 MHz, and 16 MHz bandwidths using non-TVWS spectrum. According to a representative embodiment, 802.11ah may support Meter Type Control/Machine-Type Communications (MTC), such as MTC devices in a macro coverage area. MTC devices may have certain capabilities, for example, limited capabilities including support for (e.g., only support for) certain and/or limited bandwidths. The MTC devices may include a battery with a battery life above a threshold (e.g., to maintain a very long battery life).

WLAN systems, which may support multiple channels, and channel bandwidths, such as 802.11n, 802.11ac, 802.11af, and 802.11ah, include a channel which may be designated as the primary channel. The primary channel may have a bandwidth equal to the largest common operating bandwidth supported by all STAs in the BSS. The bandwidth of the primary channel may be set and/or limited by a STA, from among all STAs in operating in a BSS, which supports the smallest bandwidth operating mode. In the example of 802.11ah, the primary channel may be 1 MHz wide for STAs (e.g., MTC type devices) that support (e.g., only support) a 1 MHz mode, even if the AP, and other STAs in the BSS support 2 MHz, 4 MHz, 8 MHz, 16 MHz, and/or other channel bandwidth operating modes. Carrier sensing and/or Network Allocation Vector (NAV) settings may depend on the status of the primary channel. If the primary channel is busy, for example, due to a STA (which supports only a 1 MHz operating mode) transmitting to the AP, all available frequency bands may be considered busy even though a majority of the available frequency bands remains idle.

In the United States, the available frequency bands, which may be used by 802.11ah, are from 902 MHz to 928 MHz. In Korea, the available frequency bands are from 917.5 MHz to 923.5 MHz. In Japan, the available frequency bands are from 916.5 MHz to 927.5 MHz. The total bandwidth available for 802.11ah is 6 MHz to 26 MHz depending on the country code.

Figure 1D:
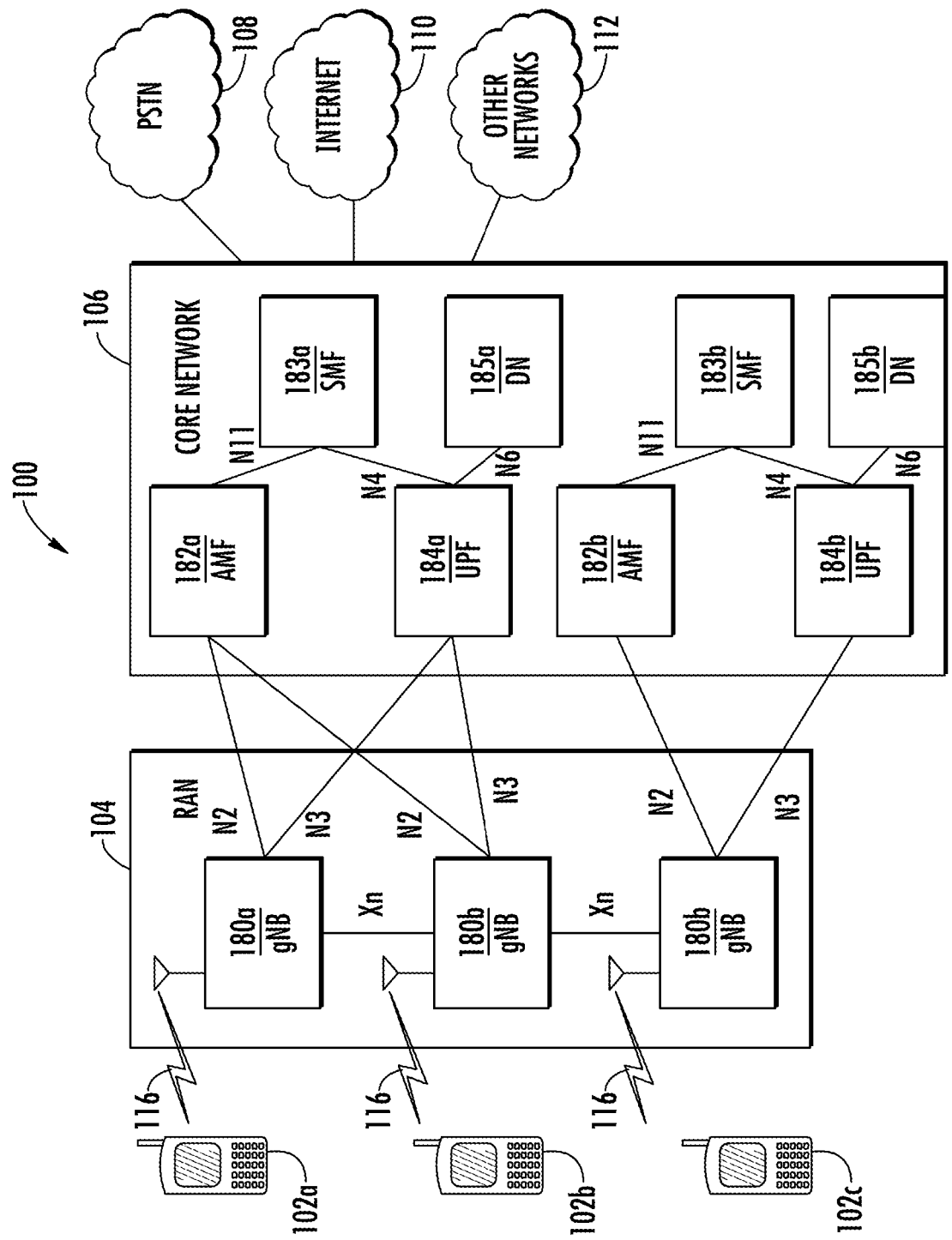

FIG. 1D is a system diagram illustrating the RAN 104 and the CN 106 according to an embodiment. As noted above, the RAN 104 may employ an NR radio technology to communicate with the WTRUs 102a, 102b, 102c over the air interface 116. The RAN 104 may also be in communication with the CN 106.

The RAN 104 may include gNBs 180a, 180b, 180c, though it will be appreciated that the RAN 104 may include any number of gNBs while remaining consistent with an embodiment. The gNBs 180a, 180b, 180c may each include one or more transceivers for communicating with the WTRUs 102a, 102b, 102c over the air interface 116. In one embodiment, the gNBs 180a, 180b, 180c may implement MIMO technology. For example, gNBs 180a, 108b may utilize beamforming to transmit signals to and/or receive signals from the gNBs 180a, 180b, 180c. Thus, the gNB 180a, for example, may use multiple antennas to transmit wireless signals to, and/or receive wireless signals from, the WTRU 102a. In an embodiment, the gNBs 180a, 180b, 180c may implement carrier aggregation technology. For example, the gNB 180a may transmit multiple component carriers to the WTRU 102a (not shown). A subset of these component carriers may be on unlicensed spectrum while the remaining component carriers may be on licensed spectrum. In an embodiment, the gNBs 180a, 180b, 180c may implement Coordinated Multi-Point (CoMP) technology. For example, WTRU 102a may receive coordinated transmissions from gNB 180a and gNB 180b (and/or gNB 180c).

The WTRUs 102a, 102b, 102c may communicate with gNBs 180a, 180b, 180c using transmissions associated with a scalable numerology. For example, the OFDM symbol spacing and/or OFDM subcarrier spacing may vary for different transmissions, different cells, and/or different portions of the wireless transmission spectrum. The WTRUs 102a, 102b, 102c may communicate with gNBs 180a, 180b, 180c using subframe or transmission time intervals (TTIs) of various or scalable lengths (e.g., containing a varying number of OFDM symbols and/or lasting varying lengths of absolute time).

The gNBs 180a, 180b, 180c may be configured to communicate with the WTRUs 102a, 102b, 102c in a standalone configuration and/or a non-standalone configuration. In the standalone configuration, WTRUs 102a, 102b, 102c may communicate with gNBs 180a, 180b, 180c without also accessing other RANs (e.g., such as eNode-Bs 160a, 160b, 160c). In the standalone configuration, WTRUs 102a, 102b, 102c may utilize one or more of gNBs 180a, 180b, 180c as a mobility anchor point. In the standalone configuration, WTRUs 102a, 102b, 102c may communicate with gNBs 180a, 180b, 180c using signals in an unlicensed band. In a non-standalone configuration WTRUs 102a, 102b, 102c may communicate with/connect to gNBs 180a, 180b, 180c while also communicating with/connecting to another RAN such as eNode-Bs 160a, 160b, 160c. For example, WTRUs 102a, 102b, 102c may implement DC principles to communicate with one or more gNBs 180a, 180b, 180c and one or more eNode-Bs 160a, 160b, 160c substantially simultaneously. In the non-standalone configuration, eNode-Bs 160a, 160b, 160c may serve as a mobility anchor for WTRUs 102a, 102b, 102c and gNBs 180a, 180b, 180c may provide additional coverage and/or throughput for servicing WTRUs 102a, 102b, 102c.

Each of the gNBs 180a, 180b, 180c may be associated with a particular cell (not shown) and may be configured to handle radio resource management decisions, handover decisions, scheduling of users in the UL and/or DL, support of network slicing, DC, interworking between NR and E-UTRA, routing of user plane data towards User Plane Function (UPF) 184a, 184b, routing of control plane information towards Access and Mobility Management Function (AMF) 182a, 182b and the like. As shown in FIG. 1D, the gNBs 180a, 180b, 180c may communicate with one another over an Xn interface.

The CN 106 shown in FIG. 1D may include at least one AMF 182a, 182b, at least one UPF 184a,184b, at least one Session Management Function (SMF) 183a, 183b, and possibly a Data Network (DN) 185a, 185b. While the foregoing elements are depicted as part of the CN 106, it will be appreciated that any of these elements may be owned and/or operated by an entity other than the CN operator.

The AMF 182a, 182b may be connected to one or more of the gNBs 180a, 180b, 180c in the RAN 104 via an N2 interface and may serve as a control node. For example, the AMF 182a, 182b may be responsible for authenticating users of the WTRUs 102a, 102b, 102c, support for network slicing (e.g., handling of different protocol data unit (PDU) sessions with different requirements), selecting a particular SMF 183a, 183b, management of the registration area, termination of non-access stratum (NAS) signaling, mobility management, and the like. Network slicing may be used by the AMF 182a, 182b in order to customize CN support for WTRUs 102a, 102b, 102c based on the types of services being utilized WTRUs 102a, 102b, 102c. For example, different network slices may be established for different use cases such as services relying on ultra-reliable low latency (URLLC) access, services relying on enhanced massive mobile broadband (eMBB) access, services for MTC access, and the like. The AMF 182a, 182b may provide a control plane function for switching between the RAN 104 and other RANs (not shown) that employ other radio technologies, such as LTE, LTE-A, LTE-A Pro, and/or non-3GPP access technologies such as WiFi.

The SMF 183a, 183b may be connected to an AMF 182a, 182b in the CN 106 via an N11 interface. The SMF 183a, 183b may also be connected to a UPF 184a, 184b in the CN 106 via an N4 interface. The SMF 183a, 183b may select and control the UPF 184a, 184b and configure the routing of traffic through the UPF 184a, 184b. The SMF 183a, 183b may perform other functions, such as managing and allocating UE IP address, managing PDU sessions, controlling policy enforcement and QoS, providing DL data notifications, and the like. A PDU session type may be IP-based, non-IP based, Ethernet-based, and the like.

The UPF 184a, 184b may be connected to one or more of the gNBs 180a, 180b, 180c in the RAN 104 via an N3 interface, which may provide the WTRUs 102a, 102b, 102c with access to packet-switched networks, such as the Internet 110, to facilitate communications between the WTRUs 102a, 102b, 102c and IP-enabled devices. The UPF 184, 184b may perform other functions, such as routing and forwarding packets, enforcing user plane policies, supporting multi-homed PDU sessions, handling user plane QoS, buffering DL packets, providing mobility anchoring, and the like.

The CN 106 may facilitate communications with other networks. For example, the CN 106 may include, or may communicate with, an IP gateway (e.g., an IP multimedia subsystem (IMS) server) that serves as an interface between the CN 106 and the PSTN 108. In addition, the CN 106 may provide the WTRUs 102a, 102b, 102c with access to the other networks 112, which may include other wired and/or wireless networks that are owned and/or operated by other service providers. In one embodiment, the WTRUs 102a, 102b, 102c may be connected to a local DN 185a, 185b through the UPF 184a, 184b via the N3 interface to the UPF 184a, 184b and an N6 interface between the UPF 184a, 184b and the DN 185a, 185b.

In view of FIGS. 1A-1D, and the corresponding description of FIGS. 1A-1D, one or more, or all, of the functions described herein with regard to one or more of: WTRU 102a-d, Base Station 114a-b, eNode-B 160a-c, MME 162, SGW 164, PGW 166, gNB 180a-c, AMF 182a-b, UPF 184a-b, SMF 183a-b, DN 185a-b, and/or any other device(s) described herein, may be performed by one or more emulation devices (not shown). The emulation devices may be one or more devices configured to emulate one or more, or all, of the functions described herein. For example, the emulation devices may be used to test other devices and/or to simulate network and/or WTRU functions.

The emulation devices may be designed to implement one or more tests of other devices in a lab environment and/or in an operator network environment. For example, the one or more emulation devices may perform the one or more, or all, functions while being fully or partially implemented and/or deployed as part of a wired and/or wireless communication network in order to test other devices within the communication network. The one or more emulation devices may perform the one or more, or all, functions while being temporarily implemented/deployed as part of a wired and/or wireless communication network. The emulation device may be directly coupled to another device for purposes of testing and/or performing testing using over-the-air wireless communications.

The one or more emulation devices may perform the one or more, including all, functions while not being implemented/deployed as part of a wired and/or wireless communication network. For example, the emulation devices may be utilized in a testing scenario in a testing laboratory and/or a non-deployed (e.g., testing) wired and/or wireless communication network in order to implement testing of one or more components. The one or more emulation devices may be test equipment. Direct RF coupling and/or wireless communications via RF circuitry (e.g., which may include one or more antennas) may be used by the emulation devices to transmit and/or receive data.

As carrier frequency increases, path loss may become severe and may limit coverage area. Transmission in millimeter wave (mmW) systems may additionally suffer from non-line-of-sight losses (for example, diffraction loss, penetration loss, oxygen absorption loss, foliage loss, etc.). During initial access, the base station and WTRU may need to overcome these high path losses and be able to discover each other. Utilizing dozens or even hundreds of antenna elements to generate a beam formed signal may be an effective way to compensate for severe path loss by providing significant beam forming gain. Beamforming techniques may include digital, analog, and hybrid beamforming.

Cell search is a procedure by which a WTRU acquires time and frequency synchronization with a cell and detects the cell ID of that cell. LTE synchronization signals may be transmitted in the $0^{th}$ and $5^{th}$ subframes of a radio frame and may be used for time and frequency synchronization during initialization. As part of the system acquisition process, a WTRU may synchronize sequentially to an orthogonal frequency-division multiplexing (OFDM) symbol, slot, subframe, half-frame, and/or radio frame based on the synchronization signals. Synchronization signals include a Primary Synchronization Signal (PSS) and a Secondary Synchronization Signal (SSS). The PSS may be used to obtain slot, subframe and half-frame boundaries. The PSS may also provide physical layer cell identity (PCI) within the cell identity group. The SSS may be used to obtain the radio frame boundary. The SSS may also enable the WTRU to determine the cell identity group, which may range from 0 to 167.

Following a successful synchronization and PCI acquisition, the WTRU may decode a Physical Broadcast Channel (PBCH) with the help of a Cell Specific Reference Signal (CRS) and acquire the Master Information Block (MIB) information regarding system bandwidth, System Frame Number (SFN) and Physical Hybrid-ARQ Indicator Channel (PHICH) configuration. It should be noted that the LTE synchronization signals and PBCH may be transmitted according to the standardized periodicity.

The embodiments described herein address the several problems associated with the PBCH in beamforming systems:

In New Radio (NR), it may be desirable to reduce beam sweep overhead and save energy or power for the PBCH. In NR, it may also be desirable to efficiently transmit system information using the PBCH. In NR, it may be desirable to enhance PBCH performance because information bits carried by PBCH may be critical.

PBCH transmissions may use a beam hopping transmission scheme to achieve energy efficiency. Beam hopping transmissions may be performed based on predefined beam hopping patterns. Alternatively, beam hopping transmission schemes may be performed based on a WTRU beam-location profile.

While, the methods described herein address problems associated with the PBCH in beamforming systems, the methods described herein may apply to other channels including but not limited to the paging channel.

Figure 2:
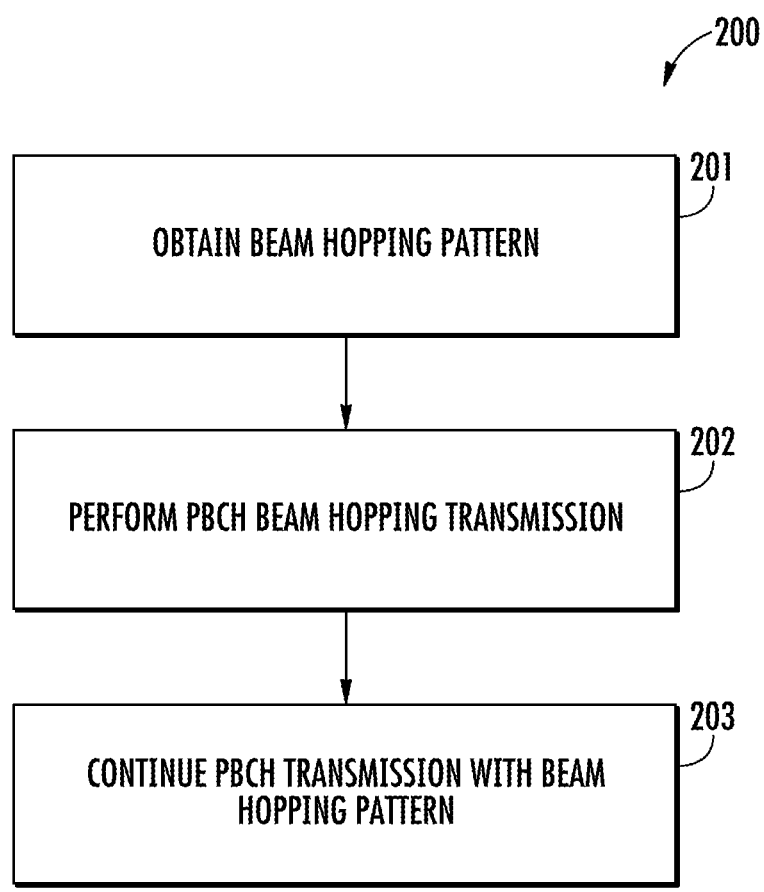
FIG. 2 is a diagram illustrating PBCH beam hopping transmission based on beam hopping patterns.

FIG. 2 is a diagram of an example PBCH beam hopping transmission based on beam hopping patterns 200. While each step of the method 200 in FIG. 2 is shown and described separately, multiple steps may be executed in a different order than what is shown, in parallel with each other, or concurrently with each other. The method of FIG. 2 may be performed by a TRP for exemplary purposes, but it may also be performed by any node operating in a wireless communications system such as base stations 114a or 114b as defined above. Beam hopping transmissions for PBCH may be performed based on predefined beam hopping patterns. Several hopping patterns for beams may be used. For example, even and odd beams may be used as the beam hopping pattern. For each beam sweeping cycle, a TRP or base station may perform beam sweeping on the even beams or odd beams. The even and odd beams may be swept alternately in time or frequency during different beam sweeping cycles. Beams may also be partitioned into multiple subsets of beams. Each subset of beams may be swept in different time or different beam sweeping bursts.

Each subset of beams may be assigned a sweeping frequency that may determine how often beam sweeping is performed. Depending on the directional distribution of the WTRU, if known, some subsets of beams may be assigned a higher frequency of beam sweeping than other subsets of beams that may be assigned a lower beam sweeping frequency. High density WTRU directions may be assigned a higher beam sweeping frequency and low density WTRU directions may be assigned a lower beam sweeping frequency. When the directional distribution of the WTRU is not known, subsets of beams may be assigned with the same frequency of beam sweeping. In this case, beams may be swept with equal probability. There may be $N_s$ subsets of beams, $\Omega_n$ where n=1, 2, 3, . . . , $N_s$. A beam sweeping frequency, $f_n$, may be assigned to beam subset $\Omega_n$ for n=1, 2, 3, . . . , $N_s$. For beam subset $\Omega_i$ with higher frequency, $f_i$, beams may be swept more frequently than the beam subset $\Omega_j$ with lower frequency, $f_j$, for $f_i > f_j$.

Referring to FIG. 2, a TRP may obtain a beam hopping pattern 201. A PBCH beam hopping transmission may then be performed 202 based on the determined beam hopping pattern. PBCH beam hopping transmission may continue with the same beam hopping pattern 203.

Figure 3:
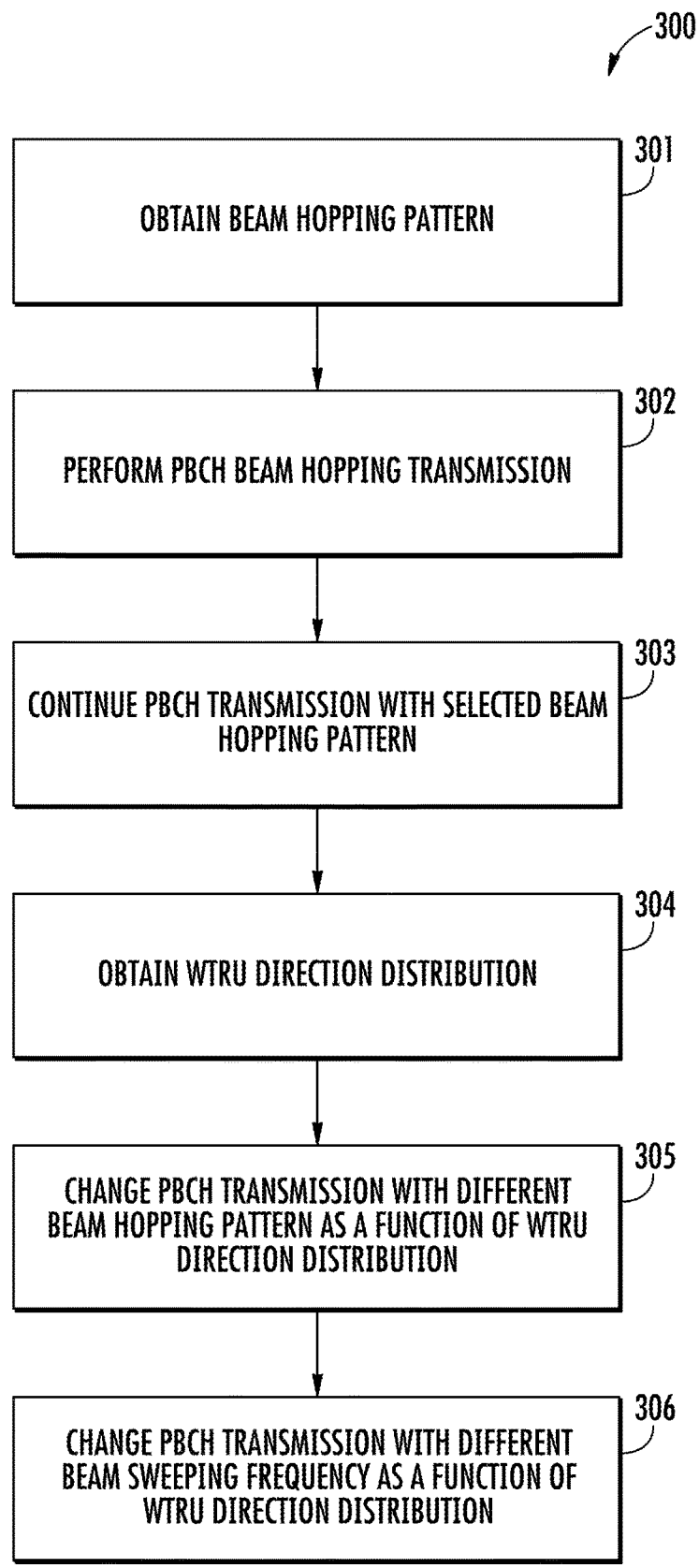
FIG. 3 is a diagram illustrating a PBCH beam hopping transmission with a distribution based beam hopping pattern.

FIG. 3 is a diagram of an example PBCH beam hopping transmission with a distribution based beam hopping pattern 300. While each step of the method 300 in FIG. 3 is shown and described separately, multiple steps may be executed in a different order than what is shown, in parallel with each other, or concurrently with each other. The method of FIG. 3 may be performed by a TRP for exemplary purposes, but it may also be performed by any node operating in a wireless communications system such as base stations 114a or 114b as defined above. The beam hopping pattern may be obtained 301, and the PBCH beam hopping transmission may then be performed 302 based on the determined beam hopping pattern. The PBCH beam hopping transmission may continue with the selected beam hopping pattern 303. The WTRU direction distribution may be obtained 304. The beam hopping pattern may be changed as a function of the WTRU direction distribution 305. The PBCH beam hopping transmission may continue with different beam hopping pattern and/or different beam sweep frequencies as a function of the WTRU direction distribution 306.

The beam hopping transmission used in the examples described herein may be performed based on a WTRU beam-location profile that may be acquired by a TRP or base station. For example, an ACK-to-PBCH scheme may be used to acquire the WTRU beam-location profile. In the ACK-to-PBCH scheme, a WTRU may detect a PBCH signal for a particular beam, and it may send back an ACK to respond to that beam. The TRP or base station may obtain the beam-location profile of the WTRU according to the reported ACKs for PBCH beams.

Figure 4:
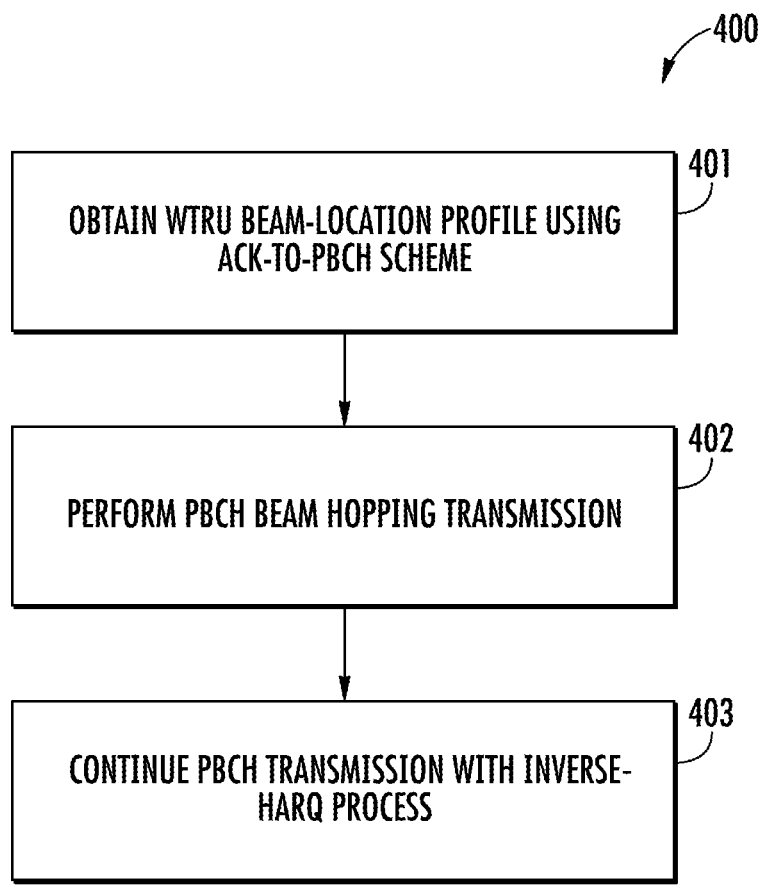
FIG. 4 is a diagram illustrating PBCH beam hopping transmission based on beam-location profile.

FIG. 4 is a diagram of an example PBCH beam hopping transmission based on a beam-location profile 400. While each step of the method 400 in FIG. 4 is shown and described separately, multiple steps may be executed in a different order than what is shown, in parallel with each other, or concurrently with each other. The method of FIG. 4 may be performed by a TRP for exemplary purposes, but it may also be performed by any node operating in a wireless communications system such as base stations 114a or 114b as defined above. In the example of FIG. 4, the TRP may first obtain the beam-location profile of WTRUs for the TRP or cell by using the ACK-to-PBCH scheme 401. The TRP may perform a PBCH beam hopping transmission 403 based on the obtained beam-location profile of the WTRUs. The TRP may continue PBCH transmission using beam hopping scheme with inverse-HARQ processes to achieve efficiency.

The TRP or base station may transmit a PBCH signal in different directions using beam sweeping. When the WTRU decodes the PBCH signal for a particular beam, the WTRU may send back an ACK to respond to that beam. The TRP or base station may receive the ACK of the beam and may learn the beam-location profile of the WTRU.

Each WTRU may send an ACK as long as it detects a PBCH signal in that beam. A cyclic redundancy check (CRC)-based ACK scheme may be used. For example, when the WTRU detects a PBCH signal and decodes it successfully (i.e., it passes the CRC test for a particular beam), a beam-specific ACK may be generated and reported by the WTRU with respect to that beam. The base station may mark the beam that has been ACK-ed when the base station receives the ACK. The base station may maintain a list of beams that have been ACK-ed. The next time the base station transmits PBCH, it may perform beam sweep on those beams which have been ACK-ed. Those ACK-ed beams may imply that there are WTRUs residing in those beams. Therefore, the ACK-to-PBCH scheme may provide the beam-location profile of WTRUs. The ACK-to-PBCH scheme may be used to implement PBCH beam hopping for PBCH transmissions. The PBCH beam hopping transmission may be energy efficient due to fewer beams participating in the beam sweep. It may also reduce the interference in a cell or to other cells due to the reduced broadcasting signal. The PBCH beam hopping transmission may also reduce latency due to potential shorter beam sweep. A short beam sweeping burst may be used to enable beam hopping to achieve low latency.

When a WTRU is stationary or WTRU mobility is low, a beam-location profile may not change. When WTRU mobility increases, the beam-location profile may change with time. Therefore, a continuing update of beam-location profile may be beneficial. Inverse HARQ processes may be used to update and refine the beam-location profile of WTRUs. However, over time the beam-location profile may be updated. This may be done by a full beam sweep. A TRP or base station may perform a full beam sweep after N TTIs. The variable N may be configurable by the TRP or base station. In between two cycles of a full beam sweep, beam hopping may be used. A full beam sweep may be used to reset and update the beam-location profile of WTRUs and ensure the WTRUs receive the PBCH signal in beams of one or more of the directions. A hybrid PBCH transmission method using full beam sweeping and beam hopping sweeping may be used.

Figure 5:
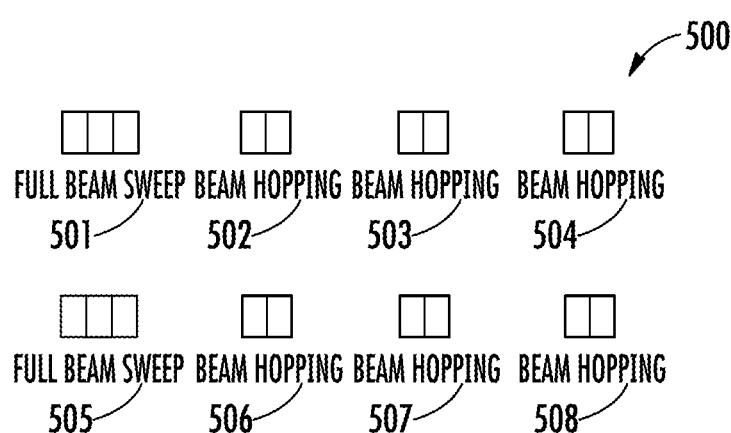
FIG. 5 is a diagram of an example hybrid PBCH transmission burst using a both full beam sweep to reset and a beam hopping sweep.

FIG. 5 is a diagram of an example hybrid PBCH transmission burst using a both full beam sweep to reset and a beam hopping sweep 500. Full beam sweep 501 for PBCH transmission may be first performed, followed by one or multiple beam hopping sweeping 502, 503, 504. Full beam sweeping 505 may be performed after $N_{full}$ TTIs while beam hopping sweep 506, 507, 508 may be performed after $N_{hop}$ TTIs and $N_{hop} \leq N_{full}$.

If a WTRU does not receive a PBCH signal in a particular beam, the WTRU may perform the following actions. First, the WTRU may wait until next full beam sweeping to receive the PBCH signal again. Alternatively, for a preset timer, if the WTRU still does not receive PBCH signal, the WTRU may initiate an UL SYNC signal to request a PBCH signal.

Beam hopping as described in the example herein may be used for energy conservation. An energy efficiency mode using beam hopping sweeping and regular mode using full beam sweeping may be defined for PBCH transmission as follows. An energy saving mode may include PBCH transmissions using beam hopping sweeping. A regular mode may include PBCH transmissions using full beam sweeping.

Depending on the WTRU population, the base station may switch between energy saving mode and regular mode for PBCH transmission. When the WTRU population becomes large and is uniformly distributed, the TRP or base station may switch to regular mode for PBCH transmission. When the WTRU population becomes small, the TRP or base station may switch to power saving mode for PBCH transmission. That is, the TRP or base station may not transmit PBCH in one or more directions or in one or more beams. Instead the TRP or base station may transmit PBCH in certain directions or beams based on the obtained beam-location profile. When the WTRU population is large but is concentrated in certain beams or directions, the TRP or base station may also switch to power saving mode for PBCH transmission. When the TRP or base station switches to power saving mode, the TRP or base station may signal to the WTRU to report ACK again. When the TRP or base station switches to regular mode, the TRP or base station may signal to the WTRU to stop reporting ACK or continue reporting ACK but with a longer reporting period.

Figure 6:
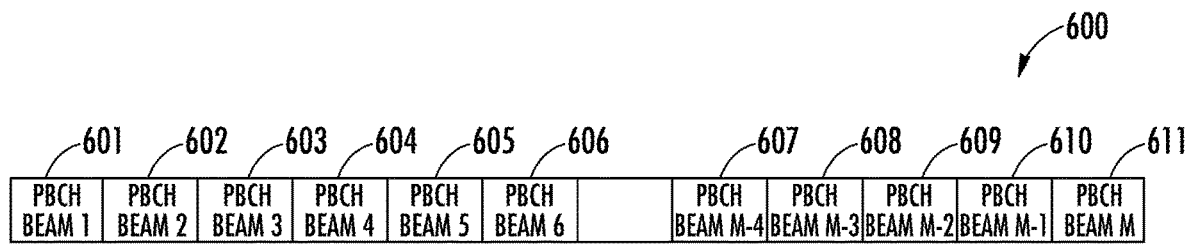
FIG. 6 is a diagram illustrating a full beam sweep burst process for PBCH.

FIG. 6 is a diagram of an example a full beam sweep burst process for PBCH 600. PBCH beams may be cycled through 601, 602, 603, 604, 605, 606, 607, 608, 609, 610, 611. This PBCH transmission burst may have high power and large latency.

Figure 7:
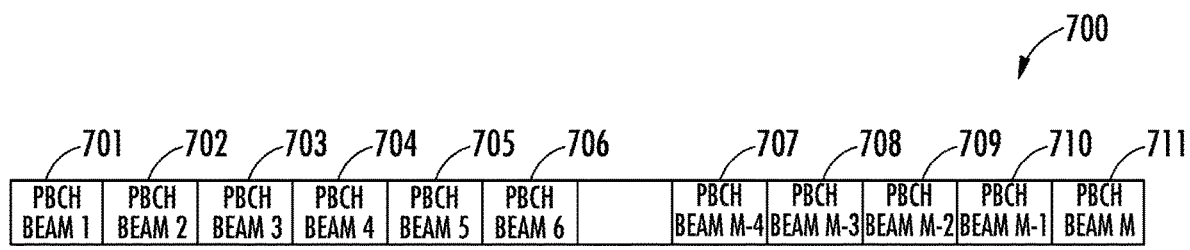
FIG. 7 is a diagram illustrating beam hopping sweeping process using full beam sweep burst for PBCH.

FIG. 7 is a diagram of an example beam hopping sweeping process using full beam sweep bursts for the PBCH 700. PBCH beams may be cycled through on certain beams 701, 702, 703, 704, 705, 706, 707, 708, 709, 710, 711. For example, beam 2 702, beam 5 705, and beam M-1 710 may be swept through and other beams may not be swept through, although the burst may accommodate one or more M beams. This PBCH transmission method may have low power and large latency.

Figure 8:
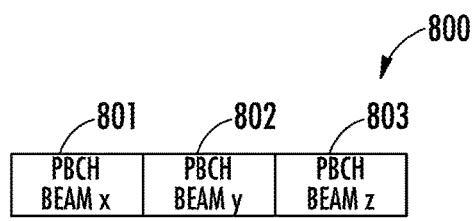
FIG. 8 is a diagram illustrating a beam hopping sweeping process using short beam hopping sweep burst for PBCH.

FIG. 8 is a diagram of an example beam hopping sweeping process using short beam hopping sweep bursts for the PBCH 800. A short beam sweeping burst may be used to enable beam hopping to achieve low latency. Since the beam hopping sweep burst may be shorter than a full beam sweep burst, it may reduce the latency for the WTRU to acquire PBCH signal. For TRPs or base stations that deploy M beams, a full beam sweep may include sweeping through one or more M beams, while beam hopping sweep may include sweeping through K beams and K<<M. In the example of FIG. 8, PBCH beams may be cycled through on certain beams. For example, beam x 801, beam y 802, and beam z 803 may be swept through. Beam x 801, beam y 802, and beam z 803 may be beam 2 702, beam 5 705, and beam M-1 710 as shown in FIG. 7. This PBCH transmission method may have low power and small latency.

As described above, the TRP or base station may switch between an energy saving mode and a regular mode for PBCH transmission. When the WTRU population becomes large and is uniformly distributed, the TRP or base station may switch to regular mode for PBCH transmission. When the WTRU population becomes small or the WTRU population is large but concentrates in certain beams or directions, the TRP or base station may switch to power saving mode for PBCH transmission. That is, the TRP or base station may not transmit the PBCH in one or more directions or in one or more beams. Instead the TRP or base station may transmit the PBCH in certain directions or beams based on the obtained beam-location profile.

Figure 9:
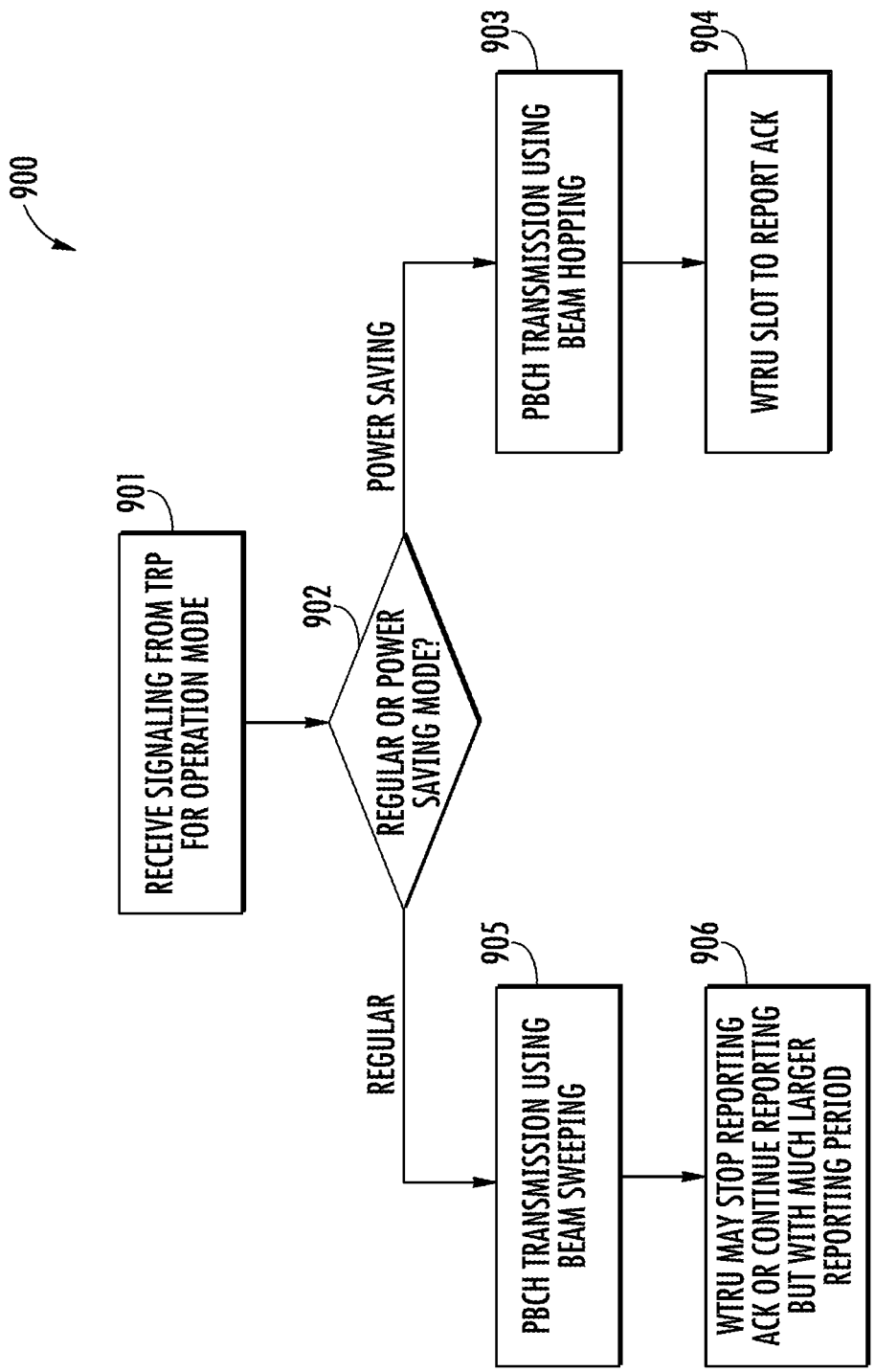
FIG. 9 is a diagram illustrating a power saving method of PBCH transmission.

FIG. 9 is a diagram of an example of a power saving method of PBCH transmission 900. While each step of the method 900 in FIG. 9 is shown and described separately, multiple steps may be executed in a different order than what is shown, in parallel with each other, or concurrently with each other. In the example of FIG. 9, when the TRP or base station switches to power saving mode, it may signal to the WTRU to indicate the power saving mode. The WTRU may receive this signal from the TRP indicating the power saving operation mode 901. The TRP or base station may use L1/2 control, semi-static signaling, RRC signaling or a combination of them to signal to the WTRU the indication of the power saving mode and regular mode.

When the TRP or base station has switched to power saving mode 902, the TRP or base station may perform PBCH transmission using a beam hopping based beam sweep (e.g., in certain directions or beams) 903, and the WTRU may start to report ACKs 904.

When the TRP or base station switches to regular mode 902, the TRP or base station may perform PBCH transmission using a full beam sweep (e.g., in one or more directions or in one or more beams) 905, and the WTRU may stop reporting ACK or continue reporting ACK but with a longer reporting period 906.

When a TRP or base station receives ACK, it may imply that there is at least one WTRU attached with this beam. Thus, the TRP or base station may continue to transmit PBCH next time after a certain time window. It is unlike HARQ, where the transmitter receives ACK and the transmitter may stop transmission.

When the TRP or base station does not receive an ACK, receives a NACK, or detects DTX, it may imply that there is no WTRU attached with this beam. Thus, the TRP or base station may stop PBCH transmission or wait for certain amount of time to retransmit due to the reset cycle. Such a time window may be configurable. It is unlike HARQ, where the transmitter receives a NACK or detects DTX and the transmitter may continue the retransmission. Since it is the inverse of regular HARQ, it may be referred to as "inverse-HARQ processes". The TRP or base station may transmit the PBCH the next time if it is requested by the WTRU.

FIG. 10 is a diagram of an example of a beam-centric PBCH transmission 1000. While each step of the method 1000 in FIG. 10 is shown and described separately, multiple steps may be executed in a different order than what is shown, in parallel with each other, or concurrently with each other. The method of FIG. 10 may be performed by a TRP for exemplary purposes, but it may also be performed by any node operating in a wireless communications system such as base stations 114a or 114b as defined above. The TRP may transmit the PBCH first in all beams 1001 to ensure the full coverage of service areas. An ACK-to-PBCH beam scheme may be performed and the WTRU beam-location profile may be obtained 1002. Based on the WTRU beam-location profile, the TRP may perform PBCH beam hopping transmission 1003. The PBCH may be transmitted in the beams directed to the WTRU according to WTRU beam-location profile. The TRP may then perform inverse HARQ processing 1004. The TRP may then retransmit the PBCH beam in response to reception of ACK 1005. The same PBCH payload or a different PBCH payload may be transmitted. The TRP may also receive a request from the WTRU for PBCH transmission 1005 when its beam is idle. In addition, the TRP may receive an ACK-to-request from the WTRU 1006 in the next PBCH transmission in an active beam. After N transmission cycles, the PBCH may be transmitted again in all beams to ensure the full coverage of service areas for all WTRUs. The entire procedure may then be repeated.

Figure 11:
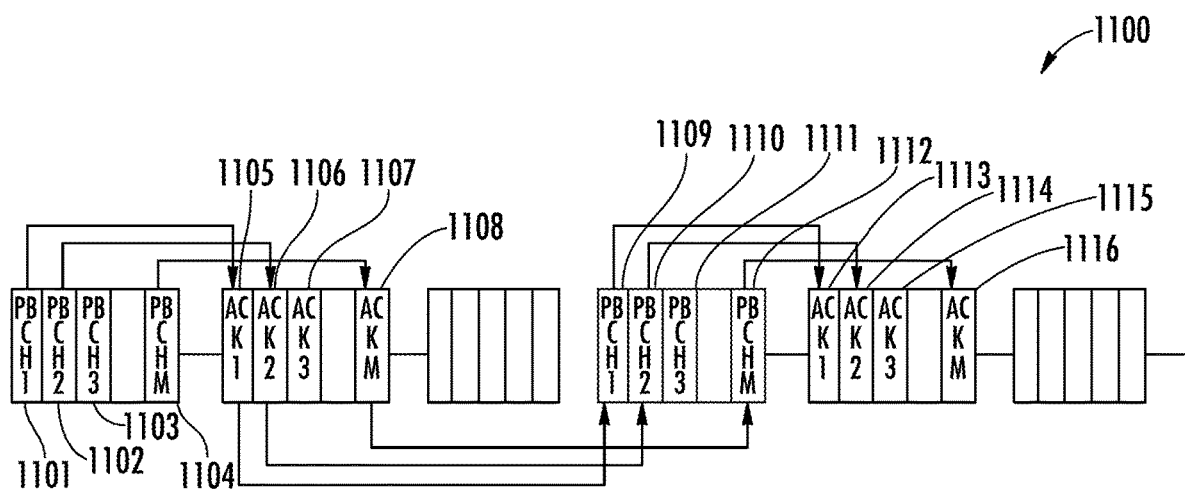
FIG. 11 is a diagram illustrating a first synchronous inverse HARQ method for PBCH transmission.

FIG. 11 is a diagram of an example of a first synchronous inverse HARQ method for PBCH transmission 1100. A TRP may transmit the PBCH in one or more directions and in one or more beams: beam 1 1101, beam 2 1102, beam 3 1103, and beam M 1104. When WTRUs are present in one or more directions and in one or more beams, the TRP may receive an ACK in those directions, such as for example, 1105, 1106, 1107, 1108. In the next PBCH transmission time, the PBCH may be transmitted again in the one or more directions and the one or more beams: beam 1 1109, beam 2 1110, beam 3 1111, beam M 1112 to cover the WTRUs from which a response was received indicating their presence for beams. The TRP may also receive an ACK in those directions 1113, 1114, 1115, 1116.

Figure 12:
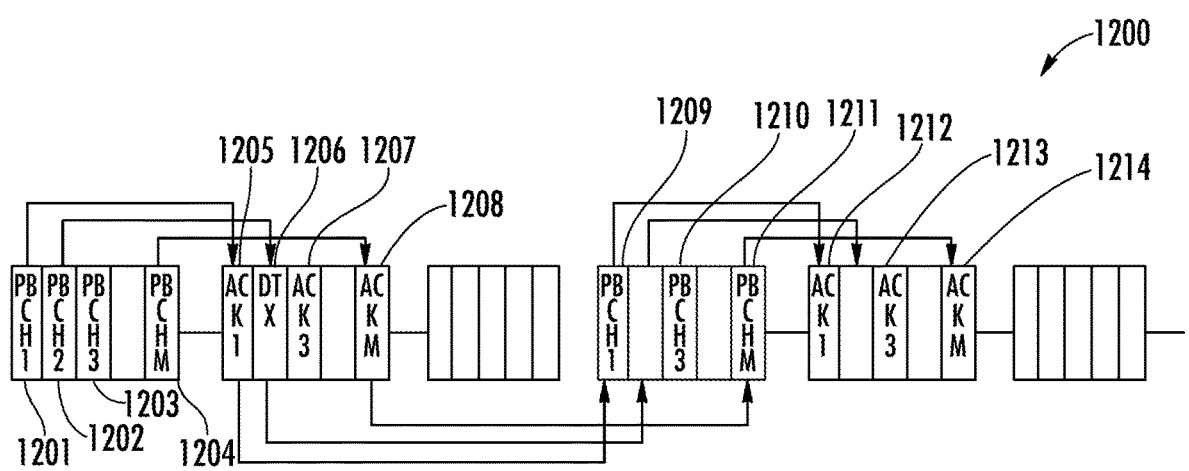
FIG. 12 is a diagram illustrating a second synchronous inverse HARQ method for PBCH transmission.

FIG. 12 is a diagram of an example of a second synchronous inverse HARQ method for PBCH transmission 1200. A TRP may transmit the PBCH in one or more directions and in one or more beams: beam 1 1201, beam 2 1202, beam 3 1203, and beam M 1204. When WTRUs are present in one or more directions and in one or more beams, the TRP may receive an ACK in those directions, such as for example, 1205, 1207, 1208. In the next PBCH transmission time, the PBCH may be transmitted again in the one or more directions and the one or more beams: beam 1 1209, beam 3 1210, beam M 1211 to cover the WTRUs from which a response was received indicating their presence for beams. The TRP may also receive an ACK in those directions 1212, 1213, 1214. If there is no WTRU present in beam 2 1202, the TRP may receive DTX 1206. In the next PBCH transmission time, the PBCH may not be transmitted in beam 2 due to no WTRU response to PBCH transmission in beam 2.

Figure 13:
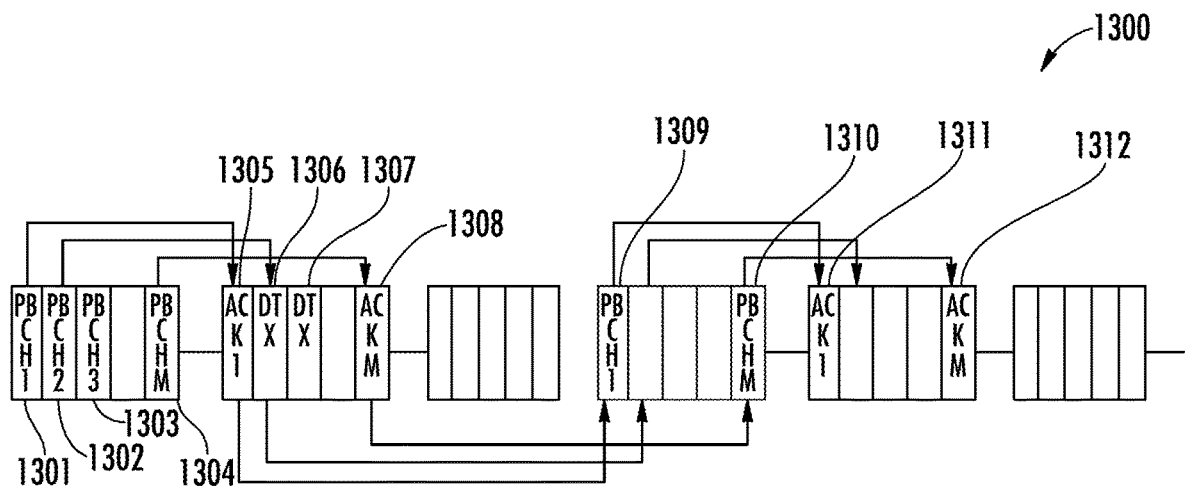
FIG. 13 is a diagram illustrating a third synchronous inverse HARQ method for PBCH transmission.

FIG. 13 is a diagram of an example of a third synchronous inverse HARQ method for PBCH transmission 1300. A TRP may transmit the PBCH in one or more directions and in one or more beams: beam 1 1301, beam 2 1302, beam 3 1303, and beam M 1304. When WTRUs are present in one or more directions and in one or more beams, the TRP may receive an ACK in those directions, such as for example, 1305 and 1308. In the next PBCH transmission time, the PBCH may be transmitted again in the one or more directions and the one or more beams: beam 1 1309 and beam M 1310 to cover the WTRUs from which a response was received indicating their presence for beams. The TRP may also receive an ACK in those directions 1311 and 1312. When no WTRU is present in beam 2 1302 and beam 3 1303, the TRP may receive DTX for beam 2 1306 and DTX for beam 31307. In the next PBCH transmission time, the PBCH may not be transmitted in beams 2 and 3 due to no WTRU response to PBCH transmission in those beams. When the WTRU detects transmission PBCH, it may report an ACK to respond to PBCH transmission for the corresponding beam as shown in the example of FIG. 13, however, the WTRU may not report ACK to respond to each PBCH transmission for the corresponding beam. For example, depending on ACK periodicity, the WTRU may report an ACK for a $K^{th}$ PBCH transmission, where K≥1 for the beam it resides.

Figure 14:
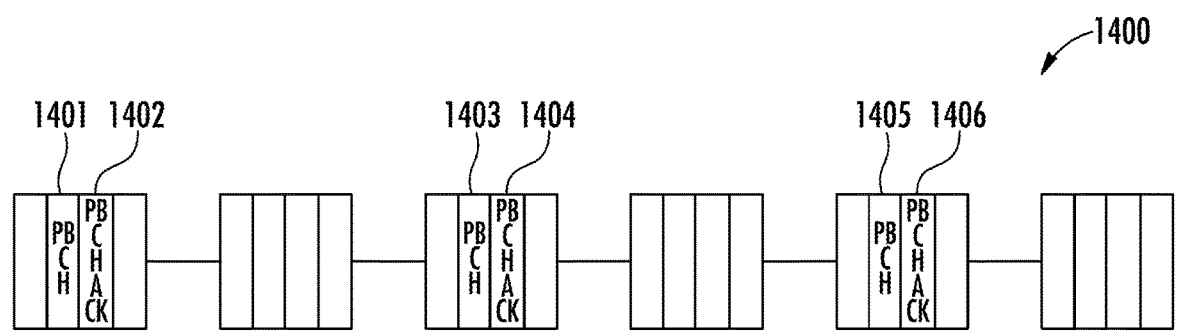
FIG. 14 is a diagram of a first example PBCH ACK transmission with a short periodicity K=1 following PBCH transmissions using beam hopping.

FIG. 14 is a diagram of a first example PBCH ACK transmission with a short periodicity K=1 following PBCH transmissions using beam hopping 1400. As shown in the example of FIG. 14, for a given WTRU, an ACK 1402, 1404, 1406 may be reported for each PBCH transmission 1401, 1403, 1405 (i.e., K=1).

Figure 15:
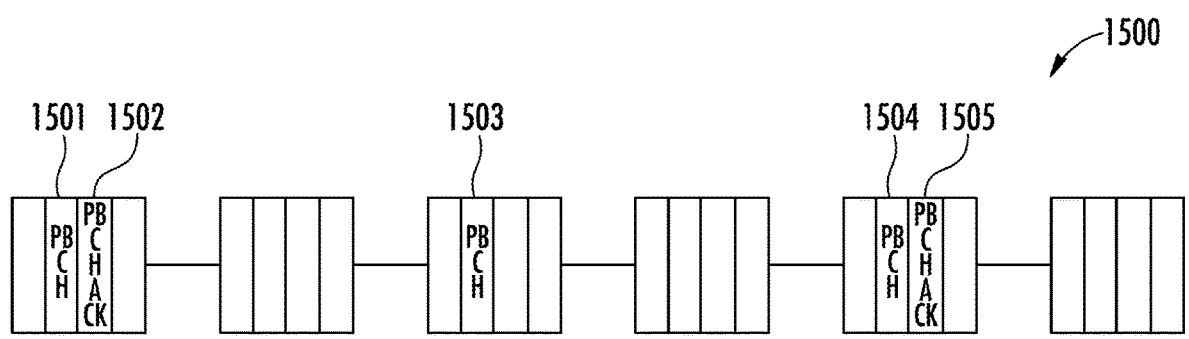
FIG. 15 is a diagram of a second example PBCH ACK transmission with a longer periodicity K=2 following PBCH transmissions using beam hopping.

FIG. 15 is a diagram of a second example PBCH ACK transmission with a longer periodicity K=2 following PBCH transmissions using beam hopping 1500. As shown in the example of FIG. 15, an ACK 1502, 1505 may be reported for alternating PBCH transmissions 1501, 1503, 1504 (i.e., K=2). When the WTRU does not detect a PBCH transmission, it may enter DTX or report a NACK to indicate that the WTRU is not present in this beam-location and/or the PBCH may not need to be transmitted in this beam for this particular WTRU.

A common resource for reporting ACKs across multiple WTRUs may be used. It may occur that more than one WTRU detects a PBCH signal in the same beam. Two or more WTRUs may send ACKs to respond to that beam. Since the TRP or base station may not need to distinguish between WTRUs, a common resource may be sufficient. The ACK resource may use preamble, sequence, time, frequency, and/or payload resources. Other alternatives may also be used, such as a fixed resource in time, frequency, code, sequence, or a preamble. In another example, an energy ON/OFF indication may be used, which may be SR-like or use signal modulation (e.g., BPSK-like or QPSK-like).

The PBCH may be used to indicate the timing index, symbol index, or beam index in a multi-beam based system. This may be implemented using a one or more bits which may be inserted into the PBCH payload or using one or more bits which may be obtained from the reserved bits of the PBCH payload. In an embodiment, an implicit method may be used to indicate the timing index, symbol index, or beam index in a multi-beam based system. A CRC with different masks in the PBCH signal may be used to indicate a particular timing index, symbol index, or beam index in a multi-beam based systems.

Figure 16:
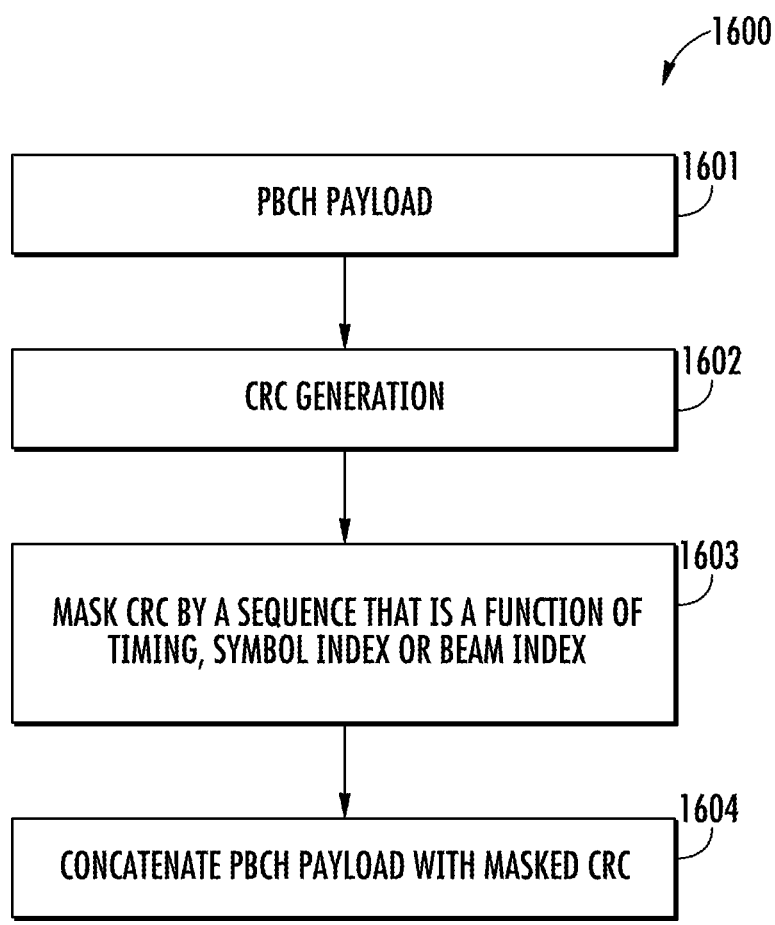
FIG. 16 is an example method for indicating the timing index, symbol index, or beam index using a CRC mask via the PBCH.

FIG. 16 is an example method for indicating the timing index, symbol index, or beam index using a CRC mask via the PBCH 1600 in accordance with one example, which may be used in combination with any of the examples described herein. While each step of the method 1600 in FIG. 16 is shown and described separately, multiple steps may be executed in a different order than what is shown, in parallel with each other, or concurrently with each other. The method of FIG. 16 may be performed by a TRP for exemplary purposes, but it may also be performed by any node operating in a wireless communications system such as base stations 114a or 114b as defined above. Depending on the number of timing, symbol indices or beam indices, a corresponding number of CRC masks may be used. A TRP may generate a PBCH payload 1601 and then may generate a CRC 1602. The TRP may mask the generated CRC with a sequence that is a function of the timing index, symbol index, or beam index 1603. The TRP may then concatenate the PBCH payload and the masked CRC with the embedded timing index, symbol index, or beam index 1604. In order to indicate N timing, symbol indices, or beam indices, one or more N sequences may be used for CRC masking. For example, a number of sequences (e.g., 8 sequences) may be used for CRC masking in a multi-beam system with multiple beams (e.g., 8 beams) participating in the beam sweep.

Figure 17:
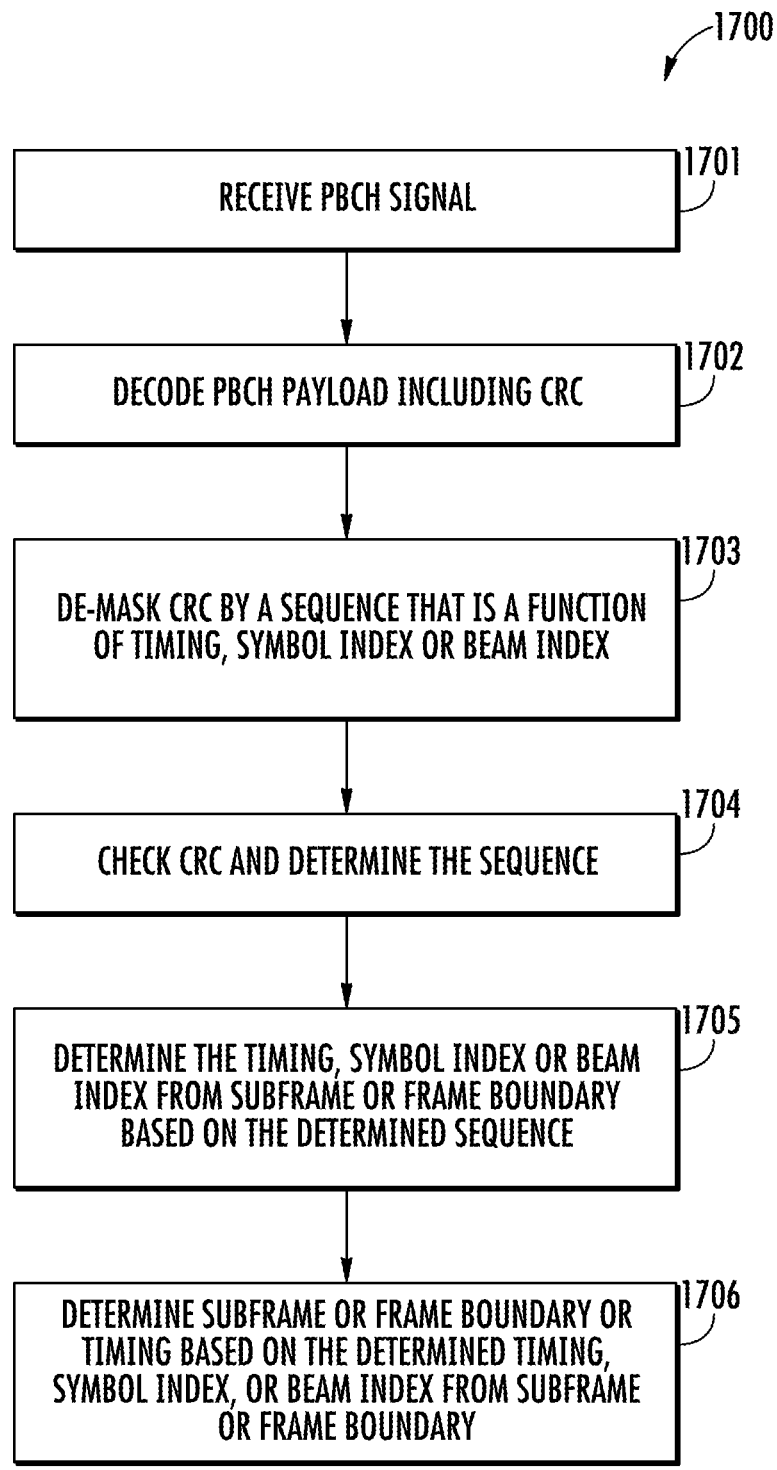
FIG. 17 is a diagram of an example method for a WTRU to obtain a timing index, symbol index, or beam index in a multi-beam system.

FIG. 17 is a diagram of an example method for a WTRU to obtain a timing index, symbol index, or beam index in a multi-beam system 1700 in accordance with one example, which may be used in combination with any of the examples described herein. While each step of the method 1700 in FIG. 17 is shown and described separately, multiple steps may be executed in a different order than what is shown, in parallel with each other, or concurrently with each other. The method of FIG. 17 may be performed by a WTRU for exemplary purposes, but it may also be performed by any node operating in a wireless communications system. A WTRU may receive a PBCH signal 1701. The WTRU may then decode the PBCH payload including the CRC 1702. The WTRU may then de-mask the CRC by a sequence that is a function of timing, symbol index, or beam index 1703. After the CRC de-masking, the WTRU may check the CRC and determine a sequence 1704. The WTRU may then determine the timing index, symbol index, or beam index from the subframe or the frame boundary based on the determined sequence 1705. The WTRU may also determine one or more of a subframe, frame boundary, or timing based on the determined timing index, symbol index, or beam index 1706.

Figure 18:
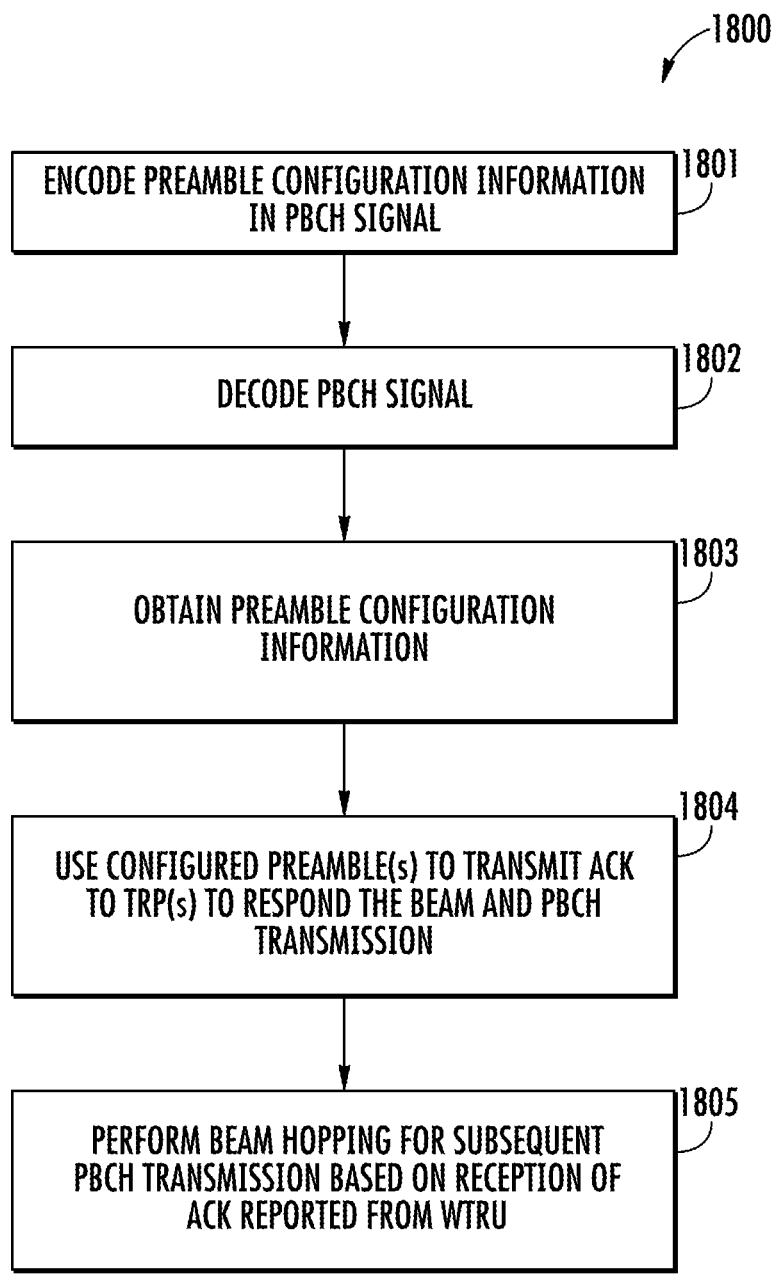
FIG. 18 is a diagram of an example method of obtaining preamble configuration information for uplink feedback.

FIG. 18 is a diagram of an example method of obtaining preamble configuration information for uplink feedback 1800 in accordance with one example, which may be used in combination with any of the examples described herein. While each step of the method 1800 in FIG. 18 is shown and described separately, multiple steps may be executed in a different order than what is shown, in parallel with each other, or concurrently with each other. The method of FIG. 18 may be performed by a WTRU for exemplary purposes, but it may also be performed by any node operating in a wireless communications system. A WTRU may receive a PBCH signal that includes encoded preamble configuration information 1801. The WTRU may then decode the received PBCH signal 1802. The WTRU may then obtain the preamble configuration information from the received and decoded PBCH signal 1803. The WTRU may use the configured preambles to transmit ACKs to the TRPs to respond the beam and PBCH transmission 1804 to enable the TRP to perform beam hopping for subsequent PBCH transmission based on reception of ACK reported from the WTRU 1805.

If a WTRU is sedentary for a prolonged period of time, its last location may be known to the TRP or base station, but its precise location may not be known. The TRP or base station may trigger a conditional beam sweep to enable the WTRU to receive the PBCH within a confined sector of its original location. A conditional beam sweep may be used to identify the location of more than one WTRU, or group of WTRUs, within a sector.

Figure 19:
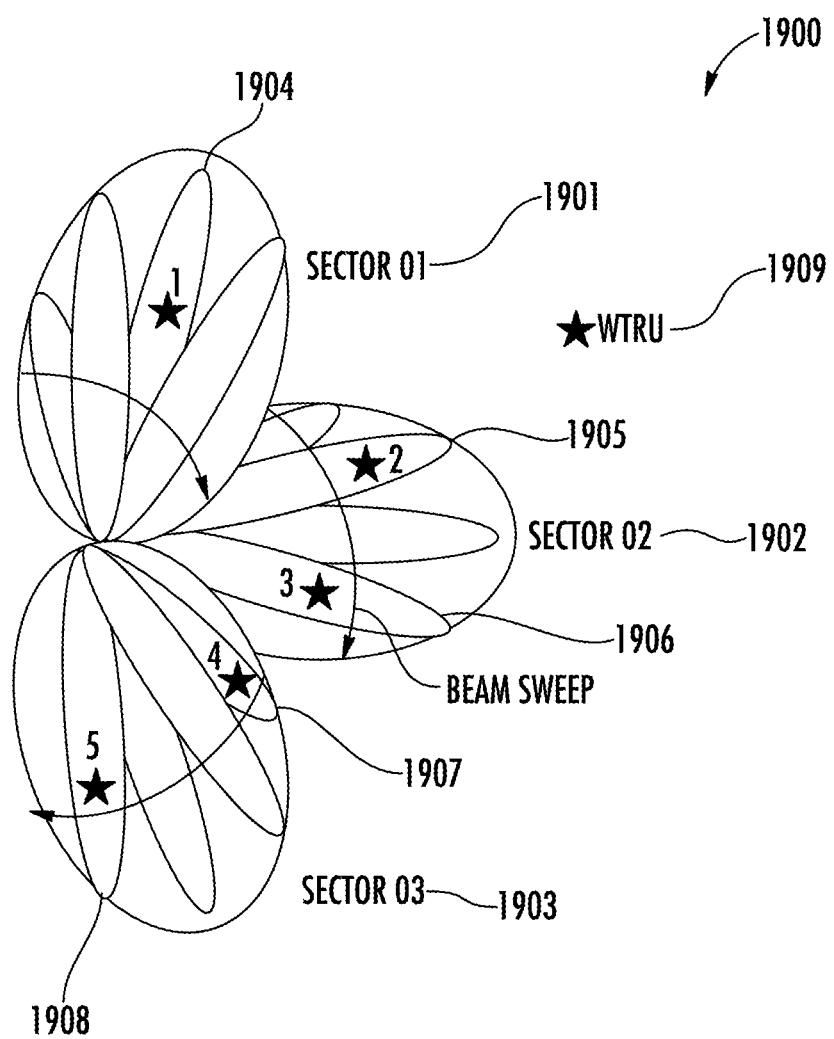
FIG. 19 is a diagram of an example of a geographic conditional beam sweep.

FIG. 19 is a diagram of an example of a geographic conditional beam sweep 1900 in accordance with one example, which may be used in combination with any of the examples described herein. The beam sweep may be confined to a sector which may contain hundreds of beams. In the example of FIG. 19, sector 1 1901, sector 2 1902, and sector 3 1903 are shown. Within these sectors are beams 1904, 1905, 1906, 1907, and 1908. During an initial acquisition, a conditional beam sweep may be defined by a starting and ending beam index, beam ID, and/or sector identification. A conditional beam sweep, using a quasi-omni composite antenna pattern, may locate a WTRU 1909 or plurality of WTRUs within specific beams. The conditional beam sweep may be following by a beam hopping procedure as described herein wherein the hops are determined by the previously identified location of the WTRUs. A schedule for a conditional beam sweep and a beam hopping procedure may be defined. A conditional beam sweep may be scheduled semi-periodically. A beam hopping procedure may be initiated by either a full, or a conditional beam sweep procedure.

An ACK may carry additional information in addition to just acknowledging the beam-location of the WTRU. The ACK may indicate or carry information including but not limited to the following: WTRU beam-location; whether PBCH may be transmitted next time based on WTRU request via ACK; and how long PBCH may be transmitted next time.

A next PBCH transmission may be requested after L time intervals of PBCH transmission for a given beam. A BPSK modulated ACK may carry 1 bit to indicate L time intervals of PBCH transmissions. For example, L may be L={1, 4} or L={1, 8}. Other value sets for L may be possible. A QPSK modulated ACK may carry 2 bits to indicate L time intervals of PBCH transmission. For example, L may be L={1, 2, 3, 4} or L={2, 4, 6, 8}. Other value sets for L may be possible.

Figure 20:
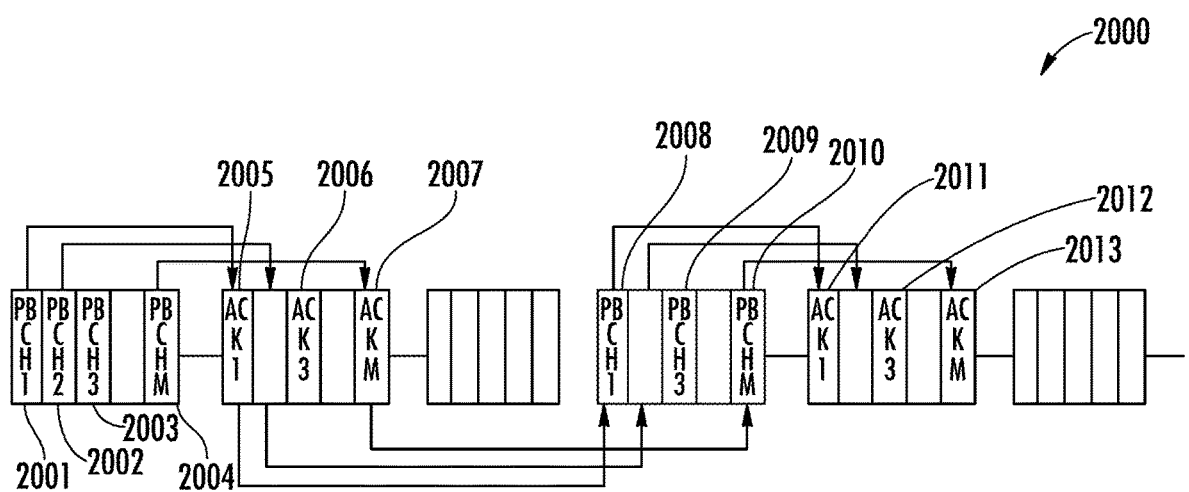
FIG. 20 is a diagram of an example for using an ACK to request PBCH transmission.

FIG. 20 is a diagram of an example for using an ACK to request PBCH transmission 2000 in accordance with one example, which may be used in combination with any of the examples described herein. In this example, an ACK may be used to request the next PBCH transmission during inverse HARQ processing. A TRP may transmit the PBCH in one or more directions and in one or more beams: beam 1 2001, beam 2 2002, beam 3 2003, and beam M 2004. When WTRUs are present in one or more directions and in one or more beams, the TRP may receive an ACK in those directions, such as for example, 2005, 2006, 2007. In the next PBCH transmission time, the PBCH may be transmitted again in the one or more directions and the one or more beams: beam 1 2008, beam 3 2009, beam M 2010 to cover the WTRUs from which a response was received indicating their presence for beams. The TRP may also receive an ACK in those directions 2011, 2012, 2013. If there is no WTRU present in beam 2 2002, the TRP may not transmit the PBCH in beam 2 in the next PBCH transmission time because no WTRU response to PBCH transmission in beam 2 was received in the previous transmission time interval.

The efficient new radio physical broadcasting channel (NR-PBCH) may be used to transmit system information for NR. After detecting a synchronization signal, a WTRU may need to obtain certain system information to access the cell or carrier. For example, the WTRU may need to acquire the system information which may be needed to carry out the random access procedure in order to gain access to the network or system.

The system information may be provided using a broadcast channel or multi-cast channel. In LTE, a MIB is transmitted on the PBCH and a system information block (SIB) is transmitted on the Physical Downlink Shared Channel (PDSCH) scheduled by the Physical Downlink Control Channel (PDCCH). On a standalone NR carrier, system information used for standalone initial access may be transmitted in a MIB and possibly SIB1 as an always-on signal. Other system information such as SIB2 and beyond may be provided on-demand or based on the request by WTRUs during or after random access.

The system information may contain a small portion of the total amount of system information that the WTRU may need. The remaining system information may be provided to the WTRU once it has accessed the network or system by other ways. For example, the remaining system information may be provided to the WTRU by dedicated signaling or WTRU-specific signaling. It may be beneficial to deploy multi-beam based operation for standalone NR carriers to enhance the performance. On the other hand, efficient multi-beam based operation may reduce the overhead due to MIB and/or SIB transmission that employs beam sweeping.

The synchronization signal and the system information for performing a random access procedure may be "always-on" signals in the system or network. These signals may be transmitted whether there is any WTRU in the cell or if not.

System information such as a MIB may be decodable based on one or more predefined identity parameters that are used for generation of a synchronization signal. The one or more predefined identity parameters used for generation of a synchronization signal may include a time or frequency resource index in addition to a sequence or a code index. Furthermore, the one or more predefined identity parameters used for generation of synchronization signal may also include a spatial or beam resource index. For example, the synchronization signal and/or MIB may be allocated in frequency location within a NR carrier bandwidth and the WTRU may identify the resource location of the MIB based on the resource location of the detected synchronization signal. The identity parameter or parameters for the synchronization signal and/or MIB may include but are not limited to broadcast ID, synchronization ID, MIB ID, SYNC ID, cell ID, sector ID, or beam ID. Identity parameter or parameters that are used for synchronization signal generation and PBCH signal transmission may not limit deployment flexibility for NR.

The transmission of always-on signals may be minimized. The synchronization signals for initial access may be an always-on signal. In order to provide forward compatibility and reduce energy consumption, the synchronization signal period in NR may be designed to be significantly larger than the periodicity of PSS/SSS in LTE or LTE-A. For example, a larger periodicity (e.g., 100 ms) may be used. This may be similar to the periodicity of discovery reference signals that were introduced in LTE Rel-12. A WTRU may need to search longer on each frequency due to increased periodicity. By reducing the number of frequencies that the WTRU may search for, the total complexity and search times may be maintained similar or the same. Initial access may be performed by the WTRU with some prior knowledge of available carriers.

System information may include the information used for initial access, such as configuration of random access preamble, signal, resource, beam or the like. System information may be broadcast to an entire cell using different methods. System information transmission may be scheduled by dynamic signaling (e.g., using a L1/2 control channel) or by semi-static signaling (e.g., by the first SIB). System information may be transmitted alone, without associated signaling, or based on a predefined association. System information may be split into several parts with separate optimized transmissions. Different transmission methods may be designed and used for each part of system information. Dynamic TDD operation may be considered for system information delivery. The MIB may be transmitted on predetermined DL resources together with synchronization signal for a standalone NR carrier.

Performance enhancements may be provided by a NR PBCH transmission structure that employs a polar encoding scheme of the system information on the PBCH. When the payload size is small, a polar encoding scheme provides better gain. The dB gain from polar encoding may accommodate additional bits. These additional bits may be used for additional random access (RACH) configuration or system information delivery (e.g., indication of TX/RX reciprocity, indication of beam operation modes such as single/multi-beam operation, etc.). Polarization may be optimized for PBCH transmission.

The contents of at least part of the SFN and CRC bits may be encoded together with other configuration information for the NR PBCH. These messages may be encoded by a polar code with a very low code rate. Instead of using repetition on top of a mother code rate of ⅓ TBCC code as in LTE, a mother code rate of, for example, a 1/12 polar code may be applied. This direct design of a low code rate polar code may achieve better performance as the codeword length is larger.

Figure 21:
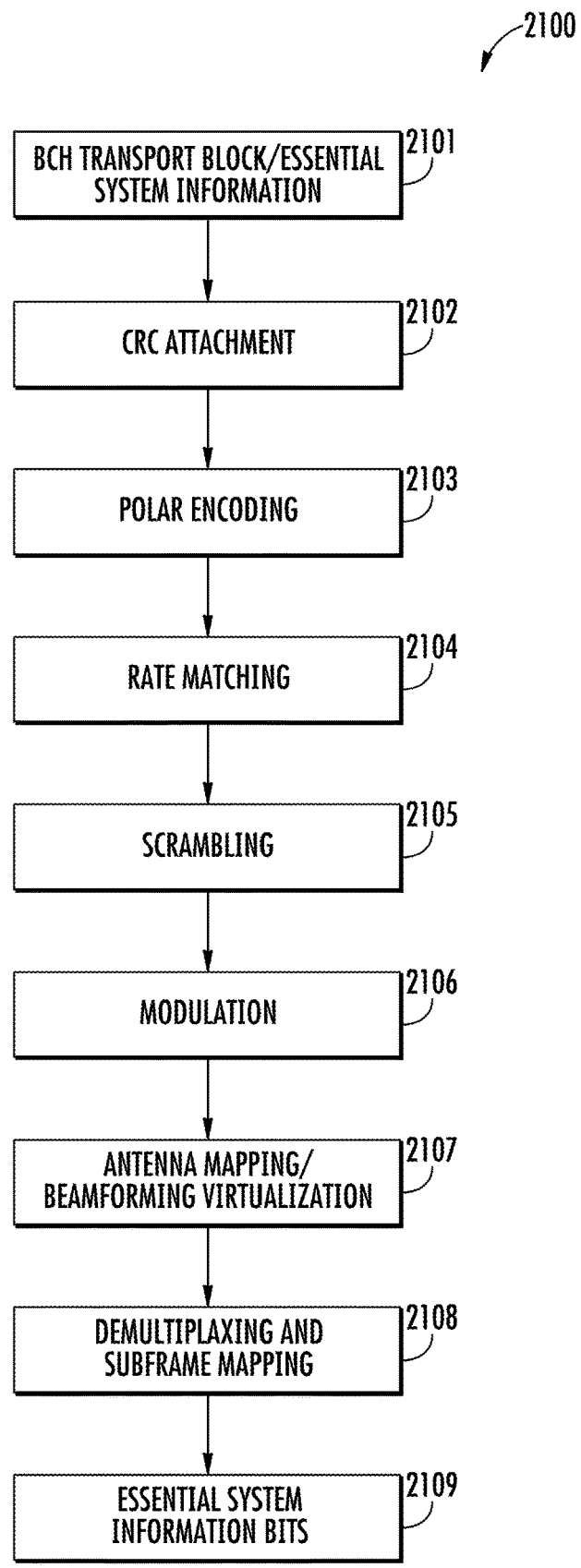
FIG. 21 is a diagram of an example method of incorporating system information into the PBCH using polar encoding.

FIG. 21 is a diagram of an example method of incorporating system information into the PBCH using polar encoding 2100 in accordance with one example, which may be used in combination with any of the examples described herein. While each step of the method 2100 in FIG. 21 is shown and described separately, multiple steps may be executed in a different order than what is shown, in parallel with each other, or concurrently with each other. The method of FIG. 21 may be performed by a TRP for exemplary purposes, but it may also be performed by any node operating in a wireless communications system such as base stations 114a or 114b as defined above. In the example of FIG. 21, performance gains may be achieved when transmitting system information using polar encoding. As described above, a PBCH transport block with essential system information 2101 may be attached with CRC bits 2102. The PBCH payload and CRC may then be encoded using a polar encoder 2103. A rate match (RM) 2104 may be performed for the coded bits which are scrambled 2105 by a scramble code and then modulated 2016. Antenna mapping, beamforming and virtualization 2107 may then be performed. De-multiplexing and subframe mapping 2108 may then be performed to generate essential system information coded bits 2109.

Figure 22:
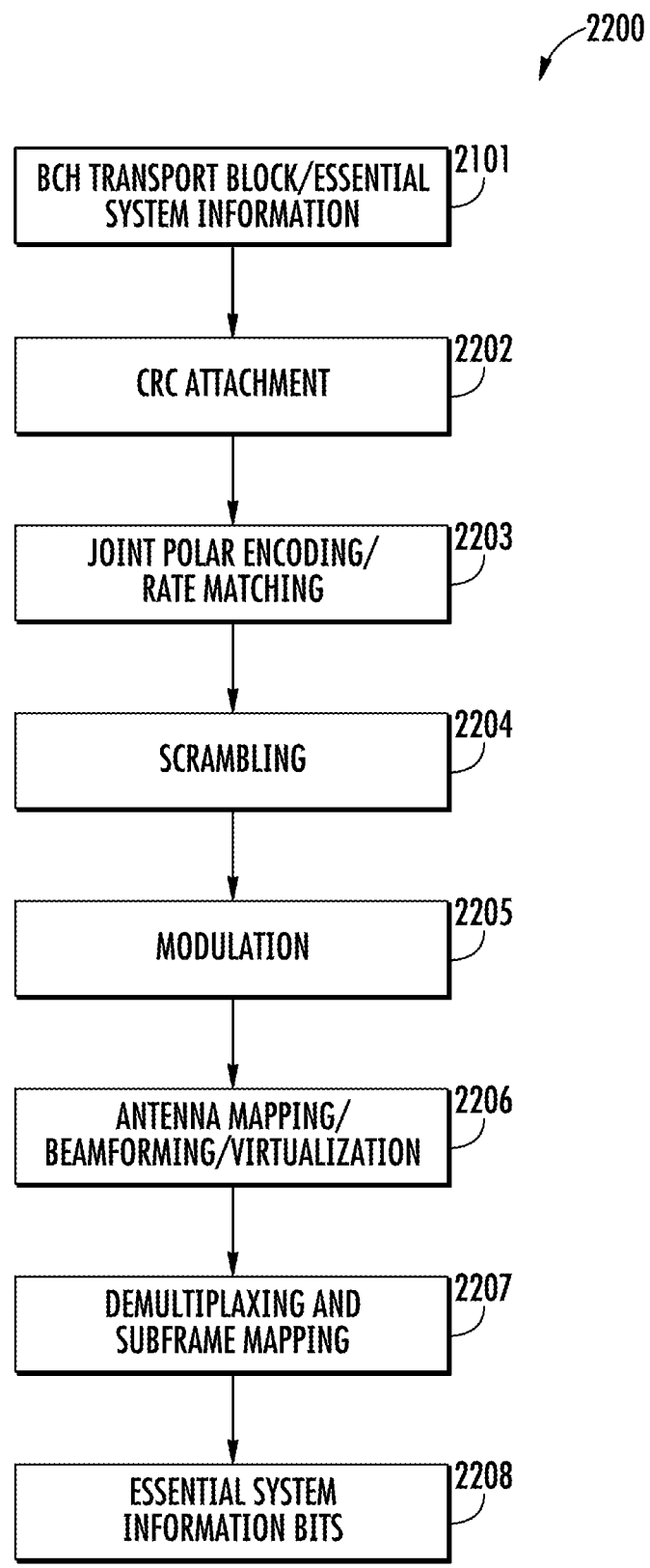
FIG. 22 is a diagram of an example method of incorporating system information into the PBCH using joint polar transformation encoding and rate matching.

FIG. 22 is a diagram of an example method of incorporating system information into the PBCH using joint polar transformation encoding and rate matching 2200 in accordance with one example, which may be used in combination with any of the examples described herein. While each step of the method 2200 in FIG. 22 is shown and described separately, multiple steps may be executed in a different order than what is shown, in parallel with each other, or concurrently with each other. The method of FIG. 22 may be performed by a TRP for exemplary purposes, but it may also be performed by any node operating in a wireless communications system such as base stations 114a or 114b as defined above. A PBCH transport block with essential system information 2201 may be attached with CRC bits 2202. The PBCH payload and CRC bits may then be encoded using a joint polar encoder and rate matching 2203. The coded bits after joint coding/RM may be scrambled 2204 by a scramble code and then modulated 2205. Antenna mapping, beamforming and virtualization 2206 may then be performed. De-multiplexing and subframe mapping may then be performed 2207 to generate essential system information coded bits 2208.

Extra performance gains may be achieved as illustrated in the examples described above, and as a result it may be possible to insert more bits into the payload of PBCH while still maintaining similar performance as a traditional PBCH at the same code rate. For example, a slightly higher code rate may be used for the proposed polar code based PBCH to accommodate an additional two bits. The original PBCH may have 14 bits. With attachment of a 16-bit CRC, the payload size of the PBCH may be 30 bits in total.

In another example, an additional one or two bits may be included to make the payload 31 or 32 bits, which may include some additional reserved bits. For example, the information bit size may be 15 or 16 bits. A 16-bit CRC may also still be used. Since the code rate may be increased, 15 or 16 bits, plus some reserved bits, may still be accommodated by the same resources of the PBCH without sacrificing performance due to extra gain achieved by using polar encoding. The additional 1 or 2 bits in this example may be used to indicate the beam sweeping configurations.

Various beam sweep configurations may be used. In a first configuration, base station RX beams may be swept first for each given WTRU TX beam i, for i=1, 2, ... $N_{base\_station\_Rx}$.

In a second configuration, WTRU TX beams may be swept first for each given base station RX beam j, for j=1, 2, ... $N_{WTRU\_TX}$.

The control field may be defined as "beam sweep indicator" or Beam_Sweep_IND. If Beam_Sweep_IND=0, the first configuration may be indicated. If Beam_Sweep_IND=1, the second configuration may be indicated. If the beam mode is not found in SYNC, or a single beam is used for SYNC while multi-beam mode is used after SYNC, the PBCH may need to indicate such information to the WTRU.

Figure 23:
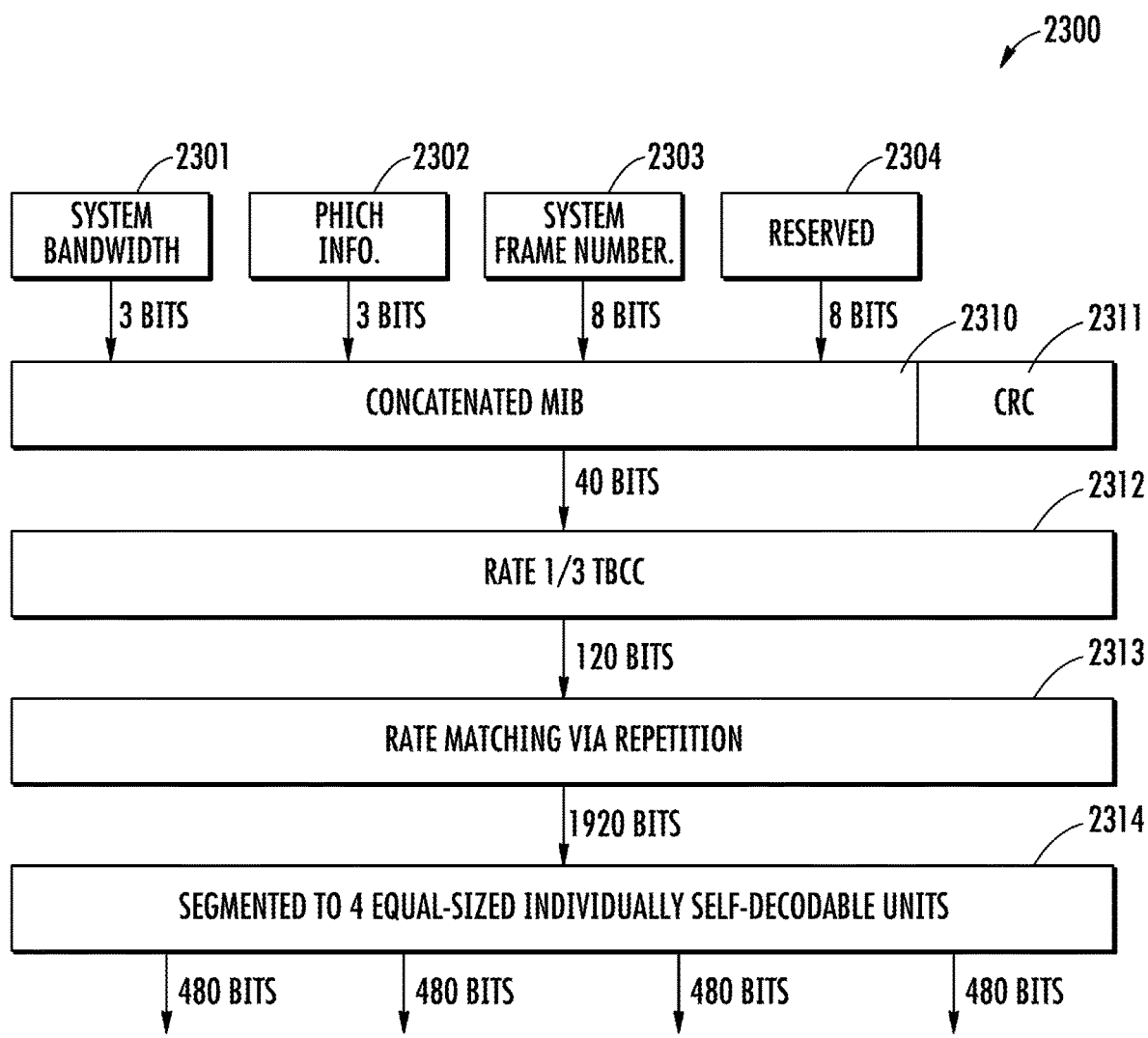
FIG. 23 is a diagram of an example LTE PBCH coding procedure.

FIG. 23 is a diagram of an example LTE PBCH coding procedure 2300. The contents of the MIB may include but are not limited to the following: 3-bit system bandwidth information 2301, 3-bit PHICH configuration information 2302, and an 8-bit SFN 2303. These 14 source bits, together with 10 reserved bits 2304 may be concatenated to 24 bits 2310, which may be appended by the 16-bit CRC 2311. The resulting 40 bits may be encoded by rate ⅓ tail-biting convolutional coding (TBCC) 2312. The output of the TBCC (120 bits) may then be rate matched to 1920 bits via repetition 2313. These 1920 bits may then be segmented to 4 equal-sized individually self-decodable units 2314, each unit assigned to the PBCH channel of a radio frame.

Figure 24:
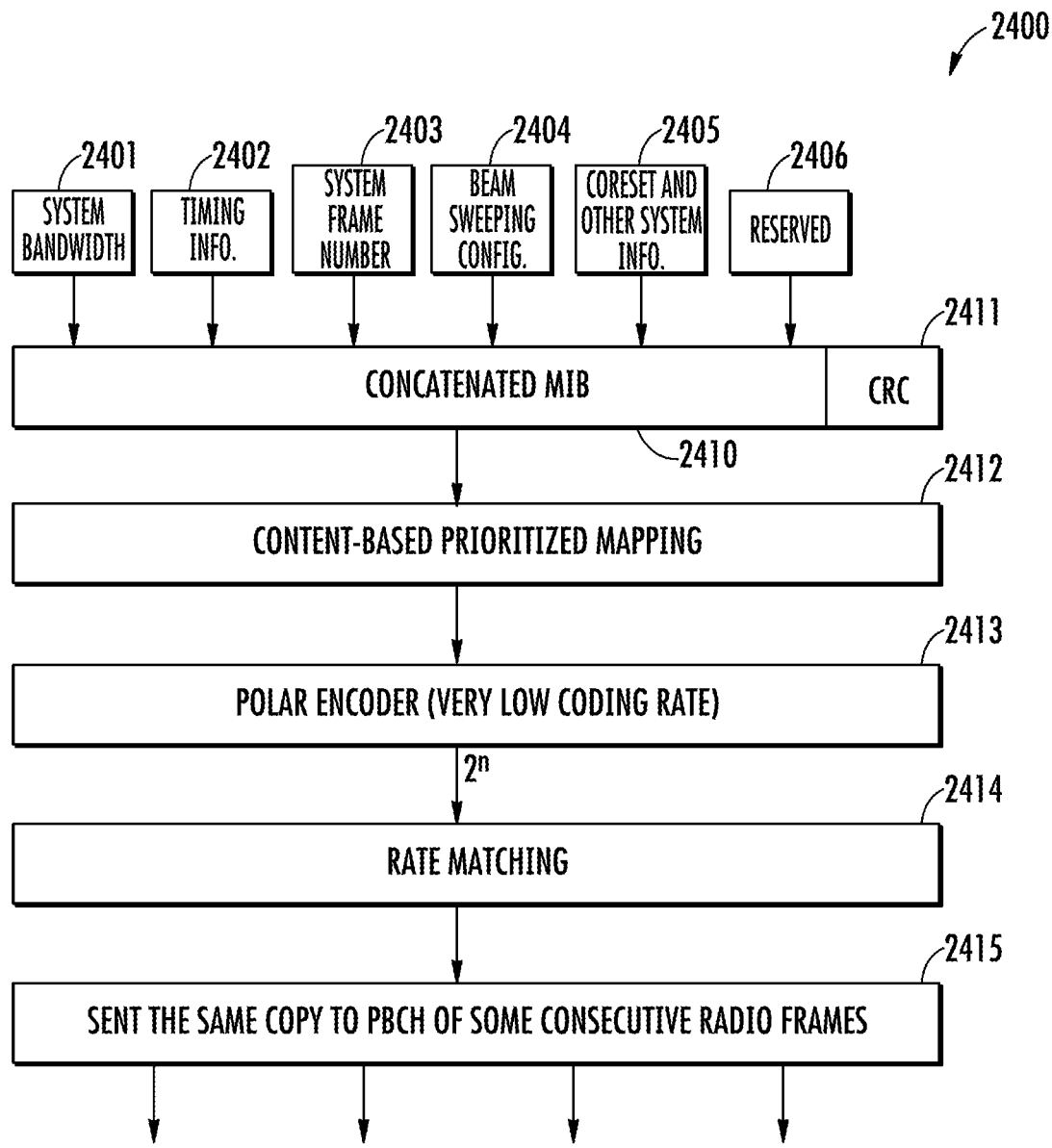
FIG. 24 is a diagram of an NR PBCH coding method.

FIG. 24 is a diagram of an NR PBCH coding method 2400 in accordance with one example, which may be used in combination with any of the examples described herein. Because polar codes may demonstrate performance advantages over TBCC codes, the example of FIG. 24 uses polar codes to encode the MIB message. While each step of the method 2400 in FIG. 24 is shown and described separately, multiple steps may be executed in a different order than what is shown, in parallel with each other, or concurrently with each other. The method of FIG. 24 is performed by a TRP for exemplary purposes, but it may also be performed by any node operating in a wireless communications system such as base stations 114a or 114b as defined above. In the example of FIG. 24, a TRP may generate a concatenated MIB transport block that includes information bits associated with extended content such as system bandwidth information 2401, timing information 2402, SFN 2403, beam sweeping configuration 2404, and control resource set (CORESET) and other system information 2405. There may be reserved bits 2406 in the concatenated MIB as well. The TRP may then attach at least 16 CRC bits 2411 to the concatenated MIB 2410. The CRC bits 2411 may be generated by cyclic generator polynomials, for example:

$$g_{CRC16}(D)=[D^{16}+D^{12}+D^5+1], \text{ for CRC length } L=16. \quad \text{Equation (1)}$$

Other cyclic generator polynomials may also be used. The CRC bits 2411 may be appended to the information bits (system bandwidth information 2401, timing information 2402, SFN 2403, beam sweeping configuration 2404, and control resource set (CORESET) and other system information 2405), or they may be put in different relative locations to the information bits.

As described above, the number of CRC bits 2411 may be more than 16 bits. Some of the CRC bits may be used for data detection, while the additional CRC bits may be used for error correction such as in a CRC-aided successive cancellation list (CA-SCL) or CRC-aided successive cancellation stack (CA-SCS) decoding schemes or decoders. Furthermore, the additional CRC bits may be added jointly to the original CRC or separately for error detection. If a parity check (PC) polar code is used to encode the NR-PBCH payload, the number of CRC bits 2411 may be equal to 16 bits.

The TRP may then prioritize the concatenated MIB 2410 and the at least 16 CRC bits 2411 based on their content 2412 such that bits associated with more important information are placed at the beginning of the concatenated MIB 2410 and CRC bits 2411 and bits associated with less important information are placed at the end of MIB 2410 and CRC bits 2411. This process is aimed to make use of the polarization feature of polar codes so that the more important bits are sent through more reliable bit channels.

For example, when performing content-based prioritization, timing information may be critical and therefore more important than other information in the MIB. As a result, timing information 2402 may be placed at the beginning of the concatenated MIB 2410 and CRC bits 2411.

The TRP may then perform channel coding of the prioritized concatenated MIB and the at least 16 CRC bits using a polar encoder with a very low coding rate 2413, such as for example a rate less than ⅓. Since polar codes are flexible on their information input bits, the coding rate of polar code may not be restricted to certain values. Unlike a TBCC code, which may have a fixed rate of ⅓, a lower coding rate may be used when performing channel coding of the prioritized bits. Furthermore, this may be done at no additional cost. In LTE, rate ⅓ TBCC code may be used followed by repetition to achieve an effectively low coding rate. However, in NR a polar code may be directly used with a much lower coding rate while avoiding the repetition operations. The direct usage of a low coding rate polar code may provide an improved coding gain. The codeword length of the polar code may be a power of 2.

The generator matrix of the polar code may be expressed by, for example:

$$G_N=B_N F^{\otimes n}, \quad \text{Equation (2)}$$

where $B_N$ is the bit-reversal permutation matrix, $F^{\otimes n}$ denotes the n-th Kronecker power of matrix F and $$F = \begin{bmatrix} 1 & 0 \\ 1 & 1 \end{bmatrix}.$$

Polar encoding may be written as:

$$X_N=u_N \cdot G_N, \quad \text{Equation (3)}$$

where $X_N$ is coded bits, and $u_N$ is the input bits. Both may be N-bits sequences. It should be noted that the information bits plus the CRC bits may be K<N bits. The mapping of the K bits to N bits may follow different ways, and the remaining N-K bits in $u_N$ may be frozen bits, which are constant (either 0 or 1).

The polar code may also be configured without the bit reversing at the encoder:

$$G_N=F^{\otimes n} \quad \text{Equation (4)}$$

In this configuration, the order of input may be changed when it is compared with the inclusion of the bit reversing matrix.

The TRP may then perform rate matching on the polar coded bits 2414 such as for example via repetition. The output bits of the rate matching block may then be assigned to the PBCH of a radio frame for transmission, and the same PBCH data may also be transmitted in the PBCHs of consecutively transmitted radio frames 2415.

Figure 25:
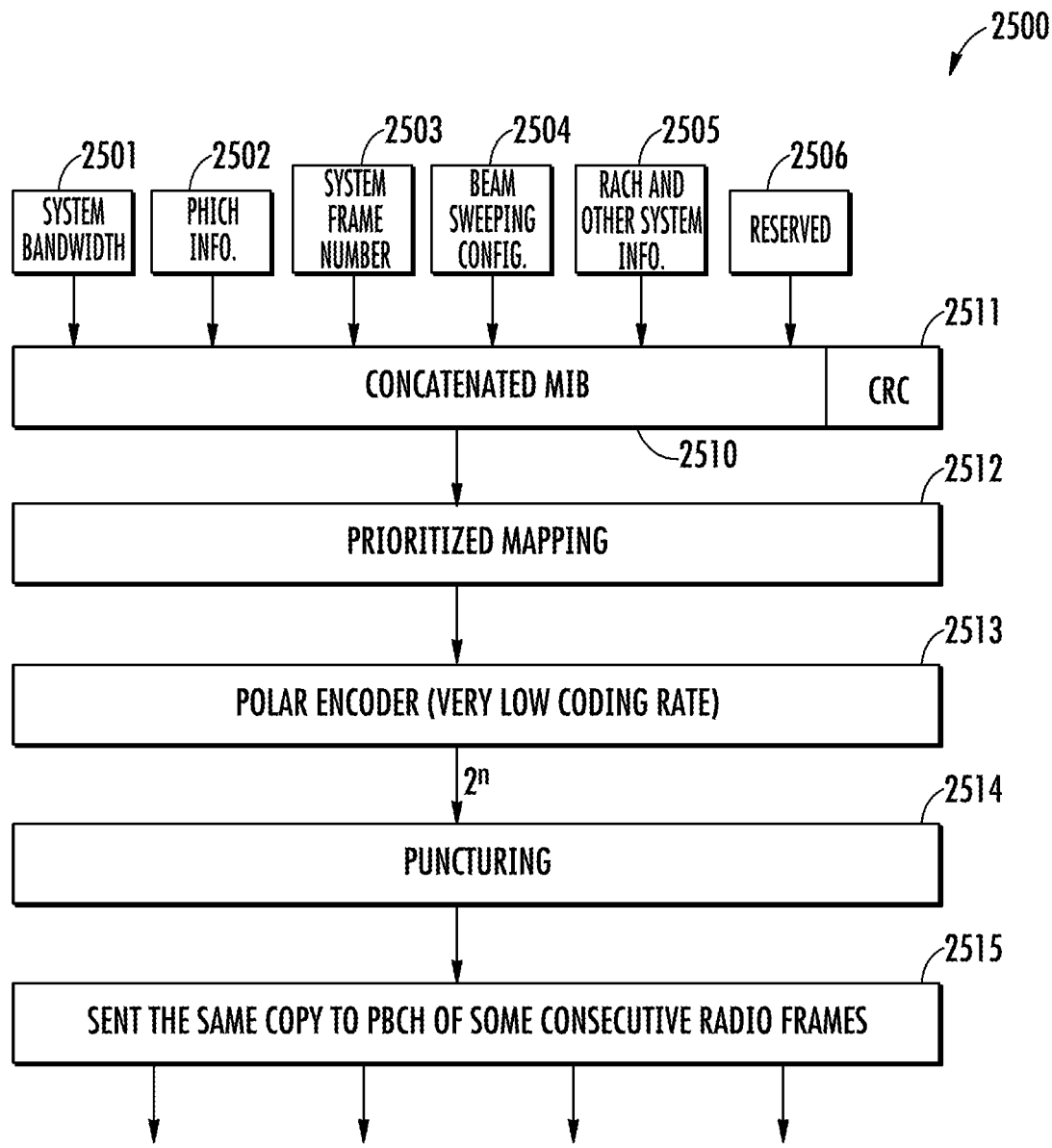
FIG. 25 is a diagram of an NR PBCH coding method.

FIG. 25 is a diagram of an NR PBCH coding method 2500 in accordance with another example, which may be used in combination with any of the examples described herein. As in the above example, polar codes are also used to encode the MIB message in the example of FIG. 25. While each step of the method 2500 in FIG. 25 is shown and described separately, multiple steps may be executed in a different order than what is shown, in parallel with each other, or concurrently with each other. The method of FIG. 25 is performed by a TRP for exemplary purposes, but it may also be performed by any node operating in a wireless communications system such as base stations 114a or 114b as defined above. In the example of FIG. 25, a TRP may generate a concatenated MIB transport block that includes information bits associated with extended content such as system bandwidth information 2501, PHICH configuration information 2502, SFN 2503, beam sweeping configuration 2504, and RACH configuration and other system information 2505. There may be reserved bits 2506 in the MIB as well. The TRP may then attach at least 16 CRC bits 2511 to concatenated MIB 2510. The CRC bits 2511 may be generated by cyclic generator polynomials using, for example, Equation (1) above. Other cyclic generator polynomials may also be used. The CRC bits 2511 may be appended to the information bits (system bandwidth information 2501, PHICH configuration information 2502, SFN 2503, beam sweeping configuration 2504, and RACH configuration and other system information 2505), or they may be put in different relative locations to the information bits.

As described above, for polar encoding of the NR-PBCH payload, the number of CRC bits 2511 may be more than 16 bits. Furthermore, if a PC polar code is used to encode the NR-PBCH payload, the number of CRC bits 2511 may be equal to 16 bits.

The TRP may then prioritize 2512 the concatenated MIB 2510 and the at least 16 CRC bits 2511 based on various criteria such as content as described above, which results in the bits associated with more important information are placed at the beginning of the concatenated MIB 2510 and CRC bits 2511 and bits associated with less important information are placed at the end of MIB 2510 and CRC bits 2511. This process is aimed to make use of the polarization feature of polar codes so that the more important bits are sent through more reliable bit channels.

The TRP may then perform channel coding of the prioritized concatenated MIB and the at least 16 CRC bits using a polar encoder with a very low coding rate 2513. As described above, polar codes are flexible on their information input bits, the coding rate of polar code may not be restricted to certain values and a much lower coding rate may be used for polar codes. The codeword length of the polar code may be a power of 2. The generator matrix of the polar code may be expressed by Equation (2) above. Polar encoding may be expressed by Equation (3) above. The polar code may also be configured without the bit reversing at the encoder as expressed by Equation (4) above. In this configuration, the order of input may be changed when it is compared with the inclusion of the bit reversing matrix.

The TRP may then perform a puncturing 2514 operation on the coded bits to fit the given resource blocks for the PBCH. The output of the puncturing block may be a bit sequence of arbitrary length. The TRP may then fit the output of the puncturing block in the PBCH of a radio frame for transmission, and same PBCH data may also be transmitted in the PBCHs of consecutively transmitted radio frames 2515.

Figure 26:
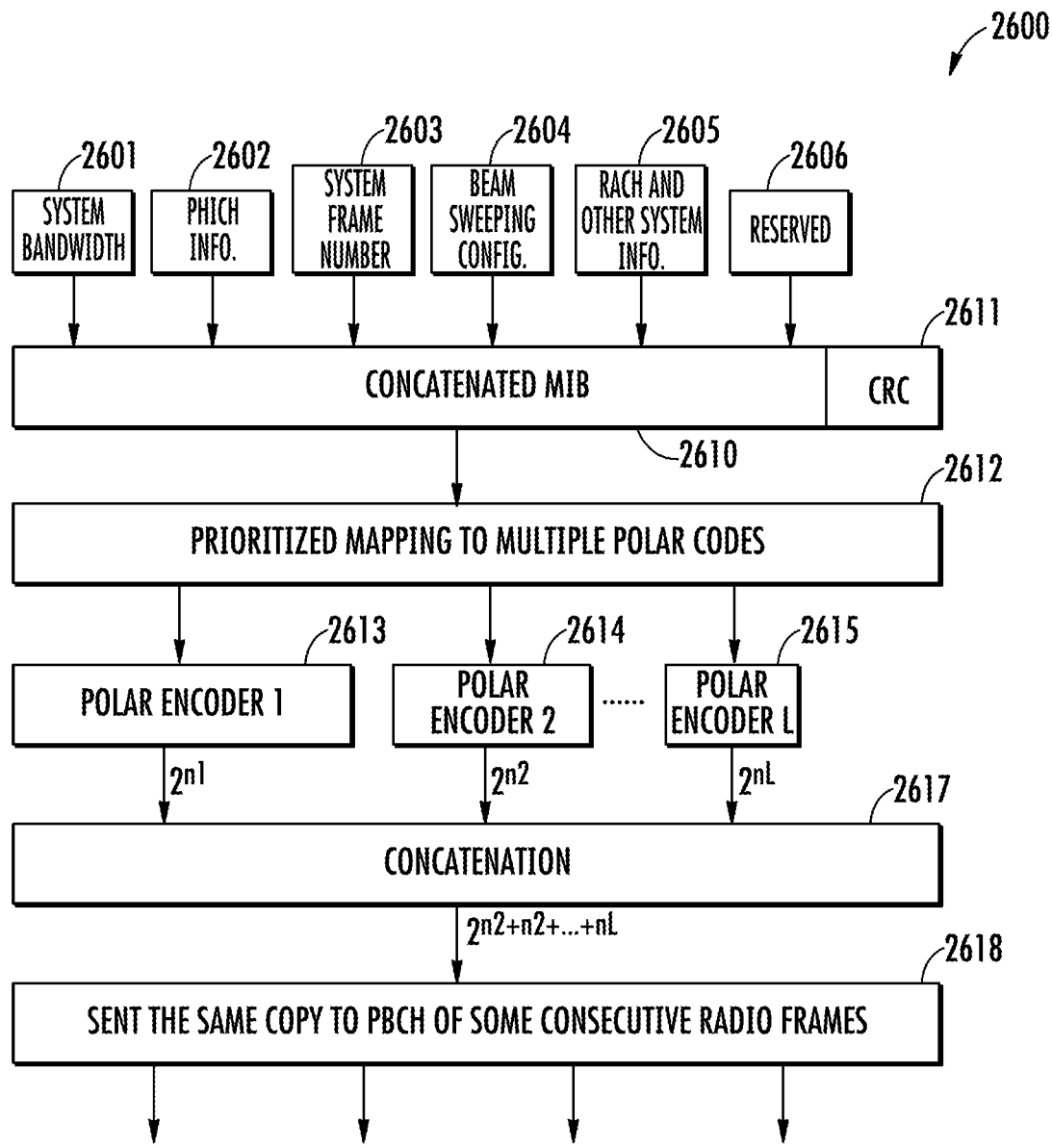
FIG. 26 is a diagram an example NR PBCH coding procedure.

FIG. 26 is a diagram an example NR PBCH coding procedure 2600 in accordance with yet another example, which may be used in combination with any of the examples described herein. As in the above examples, polar codes are also used to encode the MIB message in the example of FIG. 26. While each step of the method 2600 in FIG. 26 is shown and described separately, multiple steps may be executed in a different order than what is shown, in parallel with each other, or concurrently with each other. The method of FIG. 26 is performed by a TRP for exemplary purposes, but it may also be performed by any node operating in a wireless communications system such as base stations 114a or 114b as defined above. It should be noted that deep puncturing may severely degrade the performance of polar codes. To improve the coding performance, the example of FIG. 26 uses an alternative rate matching scheme.

Referring to FIG. 26, a TRP may generate a concatenated MIB transport block that includes information bits associated with extended content such as system bandwidth information 2601, PHICH configuration information 2602, SFN 2603, beam sweeping configuration 2604, and RACH configuration and other system information 2605. There may be reserved bits 2606 in the MIB as well. The TRP may then attach at least CRC bits 2611 to concatenated MIB 2610. The CRC bits 2611 may be generated by cyclic generator polynomials using, for example, Equation (1) above. Other cyclic generator polynomials may also be used. The CRC bits 2611 may be appended to the information bits (system bandwidth information 2601, PHICH configuration information 2602, SFN 2603, beam sweeping configuration 2604, and RACH configuration and other system information 2605), or they may be put in different relative locations to the information bits.

In the example of FIG. 26, instead of using a single polar code as in previous examples, the TRP may use multiple polar codes with different lengths. The TRP may prioritize the concatenated MIB 2610 and CRC bits 2611 to the multiple polar code blocks 2612 based on various criteria such as content as described in the previous examples above. For example, L polar codes by polar encoders 2613, 2614, and 2615 may be used, and the i-th polar code may have a codeword length $2^{n_i}$, $1 \leq i \leq L$. The selection of L and $n_1, \ldots, n_L$ may depend on the coded block length of the PBCH in each radio frame. For example, X resource elements may be allocated for the PBCH in each radio frame and QPSK modulation may be used. The coded block length of the PBCH may be 2X bits. In a conventional LTE system, the coded block length of PBCH may be 480 bits. Hence, 4 polar codes may be selected with respective codeword lengths of 256 bits, 128 bits, 64 bits and 32 bits.

The prioritized mapping to multiple polar code blocks 2612 may be considered as a matrix production operation. For example, the input to this block may be a vector A of t bits. The output of this block may be $\Sigma_{i=1}^{L} n_i$, which may match the L polar codes of lengths $n_1, \ldots,$ Here, the design of this block may be a matrix W of size $t \times \Sigma_{i=1}^{L} n_i$. The output may be calculated as A·W in a GF(2) field. The design of the matrix W may also consider the importance of the input bits. The first $n_1$ bits of the outputs may be encoded by polar code 1 with length $n_1$, the next $n_2$ bits of the outputs may be encoded by polar code 2 with length $n_2$, etc.

The outputs of these L polar codes may be concatenated 2617. These concatenated bits may be further scrambled and modulated to fit in a PBCH of a radio frame for transmission, and the same PBCH data may also be transmitted in the PBCHs of consecutively transmitted radio frames 2618.

Figure 27:
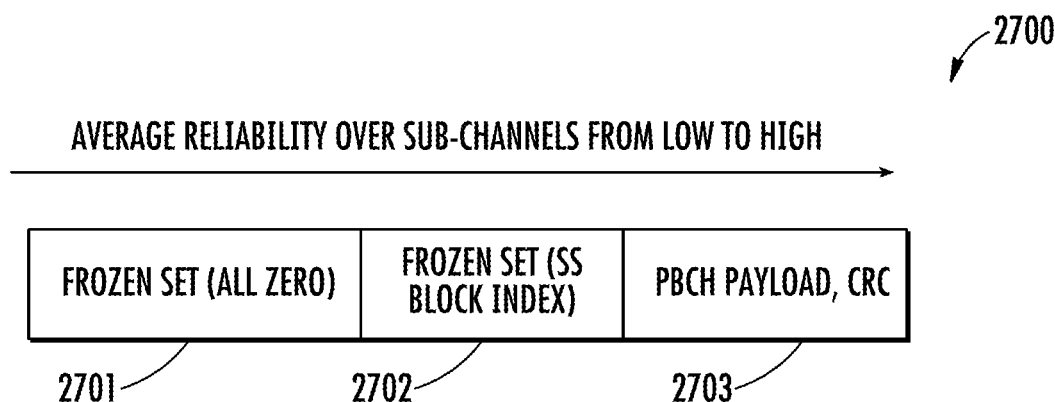
FIG. 27 is a diagram of an example of PBCH polar encoding with an implicit synchronization signal (SS) block index.

FIG. 27 is a diagram of an example of PBCH polar encoding with an implicit synchronization signal (SS) block index 2700 in accordance with an example, which may be used in combination with any of the examples described herein. The NR-PBCH may be transmitted and multiplexed together with PSS and SSS signals within a SS block. The SS block index may be contained in NR-PBCH. When using polar codes, the SS block index may be implicitly indicated by NR-PBCH, via operations on the polar codes. Referring to FIG. 27, the SS block index may be implicitly encoded via polar codes by putting the SS block index 2702 as frozen bits in polar codes. For example, there may be four SS block indices, denoted by two bits, 00, 01, 10, or 11. These two bits may be placed in the locations of the two most reliable frozen bits. A TRP may encode the NR PBCH payload together with the SS block index bits and CRC bits as information bits. This may imply that the SS block index is explicitly contained in NR-PBCH.

Alternatively, the SS block index may be placed in the locations of frozen bits which may not be encoded as information bits. Instead, The WTRU may perform the blind detection using the four possible values of 00, 01, 10, or 11 for frozen bits. The WTRU may perform the polar decoding using four possible fixed frozen bit values of 00, 01, 10, or 11. Only the proper values on the frozen bits may result in the correct decoding at the WTRU side. The SS block index may be implicitly detected together with the NR PBCH message. The SS block index may also be XOR-ed or scrambled by a cell ID, or part of a cell ID, to reduce the false alarm rate.

The example of FIG. 27 shows that the NR-PBCH may also include another frozen set of all zero 2701 before the SS block index 2702 frozen set and PBCH payload and CRC 2702.

Figure 28:
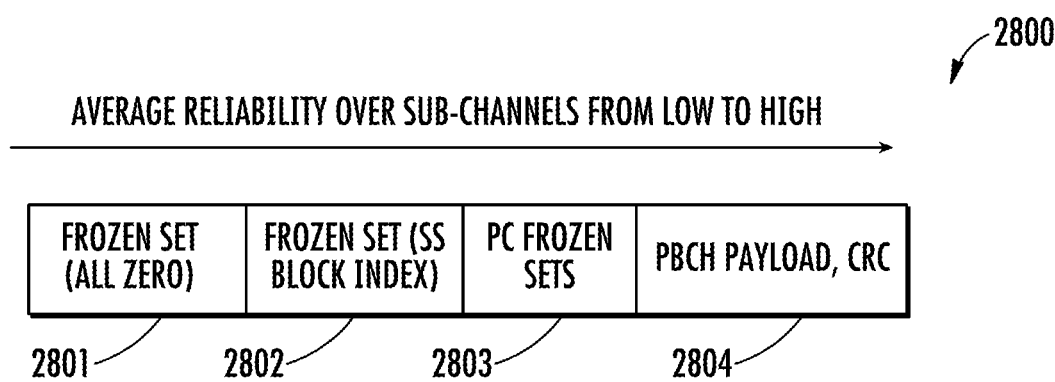
FIG. 28 is a diagram of PBCH PC polar encoding with an implicit SS block index in frozen bits.

A similar approach may be used on PC polar codes. Here, the SS block index may be placed in the locations of a frozen set or PC-frozen sets. FIG. 28 is a diagram of PBCH PC polar encoding with an implicit SS block index in frozen bits 2800 in accordance with an example, which may be used in combination with any of the examples described herein. The example of FIG. 28 shows that the NR-PBCH may also include another frozen set of all zero 2801 before the SS block index 2802 frozen set, PC frozen sets 2803, and PBCH payload and CRC 2804.

Figure 29:
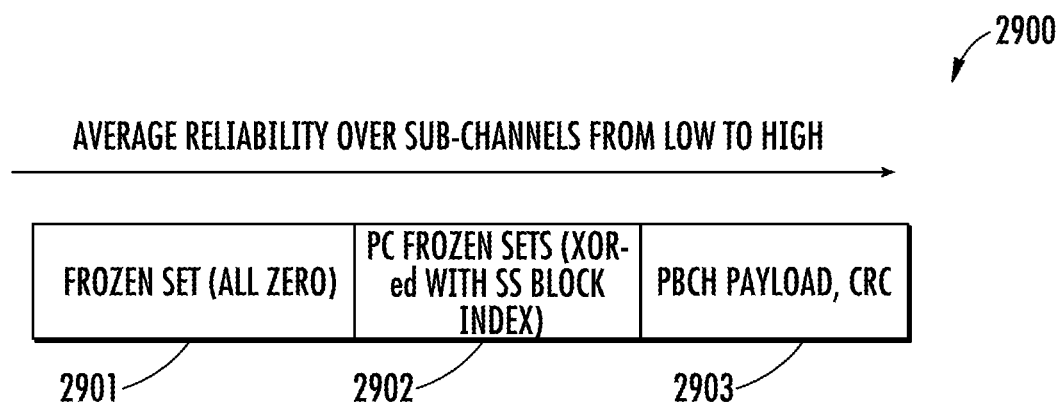
FIG. 29 is a diagram of an example of PBCH PC polar encoding with a SS block index in PC frozen bits.

FIG. 29 is a diagram of an example of PBCH PC polar encoding with a SS block index in PC frozen bits 2900 in accordance with an example, which may be used in combination with any of the examples described herein. The example of FIG. 29 shows that the NR-PBCH may also include another frozen set of all zero 2901 before the PC frozen set XOR-ed with the SS Block index 2902 and PBCH payload and CRC 2903.

Figure 30:
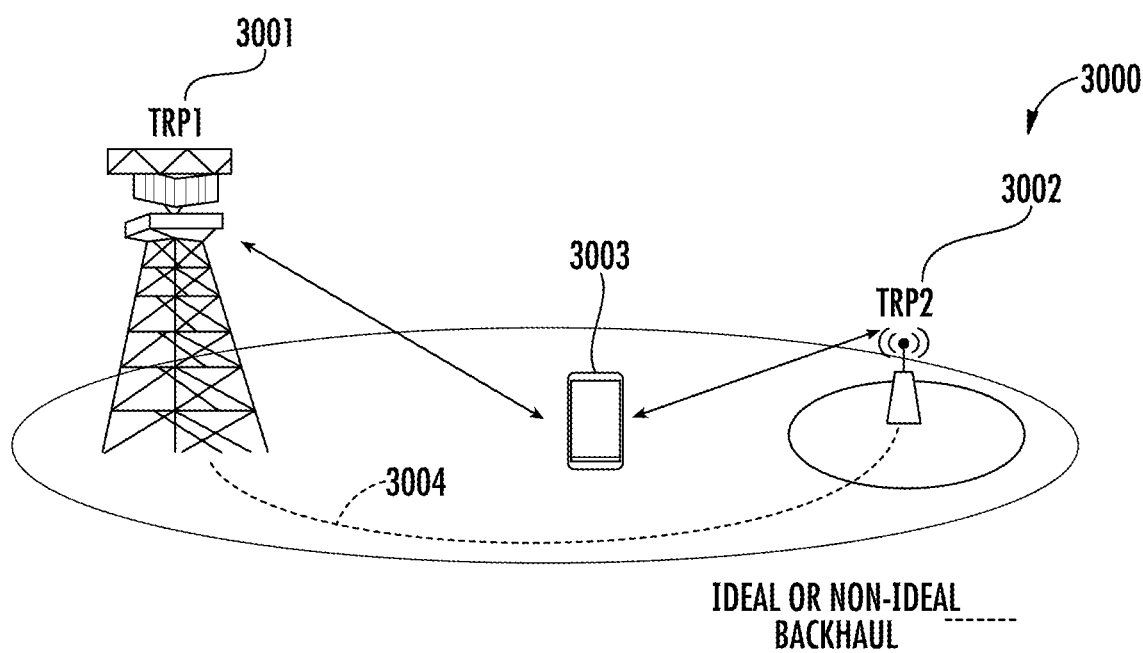
FIG. 30 is an example of WTRU communication with two TRPs.

FIG. 30 is an example of WTRU communication with two TRPs 3000 in accordance with an example, which may be used in combination with any of the examples described herein. TRP1 3001 may be, for example, a macro cell or gNB. TRP2 3002 may be, for example, a small cell that may be within the coverage area of TRP1 3001. There may be an ideal backhaul (e.g., zero delay communication) or a non-ideal backhaul 3004 between the TRP1 3001 and TRP2 3002. TRP1 3001 may be used to assist WTRU 3003 with one or more procedures, such as cell search, TRP selection, and/or beam selection, with or for a TRP2 3002. Assistance information, data, and/or parameters that a TRP may provide to a WTRU and/or that may be used by a WTRU may be referred to as WTRU-assistance data. Assistance information, data and/or parameters that a TRP may provide to another TRP and/or that may be used by another TRP may be referred to as TRP-assistance data.

TRP1 3001 may be considered a primary TRP, or an anchor TRP. TRP2 3002 may be considered a secondary TRP, or a non-anchor TRP. Communication with the TRP1 3001 and TRP2 3002 may be with the same or different radio access technology (RAT). TRP1 3001 and TRP2 3002 may also be co-located, or a gNB and TRP2 may be co-located and the gNB may be an anchor cell. TRP1 3001 may or may also provide assistance to TRP2 3002, for example, to enable TRP2 3002 to transmit at least some of its signals (e.g., sync, reference, etc.) more efficiently.

WTRU 3003 may be in communication with the TRP1 3001, which may transmit assistance data to WTRU 3003 for one or more other TRPs. WTRU 3003 may receive assistance information from TRP1 3001. The assistance data may enable WTRU 3003 to synchronize with and/or receive one or more signals, channels, and/or data from TRP2 3002. The one or more signals may include a synchronization signal, broadcast signal, reference signal, or the like. The one or more channels may include a control channel, a data channel, and/or a broadcast channel. Data may be user data or system information. It should be noted that the terms information and data may be used interchangeably herein.

A first synchronization step may comprise at least synchronization with NR-PSS. A second synchronization step may comprise at least synchronization with NR-SSS. Assistance data may refer to WTRU-assistance data and/or TRP-assistance data.

The assistance data, for example from a first TRP, may include at least one of the following parameters for a second TRP:

Timing and/or transmission parameter related synchronization (sync) signals;

Timing and/or transmission parameters related to reference signals (e.g., beam reference signals);

Beam sweep information, such as number of beams that may be transmitted and/or the timing of the beams;

Aa beam sweeping procedure or method such, as forward hierarchical beam sweep using successively narrower beams or backward hierarchical beam sweep using successively wider beams;

An association of reference signals with IDs (e.g., beam IDs);

A subframe (or other time period) structure and/or numerology, which may include subcarrier spacing and cyclic prefix and which may be used in non-stand alone (NSA) carrier access;

A timing relationship (e.g., offset) between a reference point (e.g., subframe start) or signal (e.g., sync signal) of TRP1 and a reference point or signal of TRP2; and Timing and/or transmission parameters related to a control channel transmission that may be associated with a beam or reference signal.

At least some assistance data may be provided to both a WTRU and TRP2 so that TRP2 and the WTRU may have common knowledge. Beam sweep information may be for a sync signal, a reference signal, a broadcast channel, a control channel, and/or a random access channel, among others.

A WTRU may use the assistance data from TRP1 to do at least one of the following actions:

Determine the timing of a sync signal transmitted by TRP2. This may also include determining the presence/absence of sync signal, number of sync signals if present and the corresponding frequency location(s) of sync signal(s) transmitted by TRP2;

Receive a sync signal from TRP2 and/or synchronize in time/frequency with TRP2 (e.g., with a transmission from TRP2);

Determine a timing of a reference signal (RS) from TRP2 and/or synchronize in time/frequency with a reference signal from TRP2;

Associate a reference signal (e.g., beam reference signal) received from TRP2 with an ID (e.g., a beam ID);

Determine a timing of a control channel (e.g., a DL control channel);

Determine a structure or numerology of a subframe or other time period (for example, the WTRU may use the assistance data to determine the time and/or frequency location of at least one of a DL control channel, an UL control channel, a DL data channel, and/or an UL data channel that may be in a subframe or other time period); and Determine the beam sweep procedure or method that may be used.

Numerology may include at least one of subcarrier spacing, cyclic prefix, and/or a symbol duration.

A second TRP that receives TRP-assistance data from a first TRP may transmit one or more signals (e.g., synchronization signals, reference signals, control channels, and/or data channels) in accordance with the TRP-assistance data. A second TRP that receives TRP-assistance data from a first TRP may use a beam sweeping procedure indicated by the first TRP.

A WTRU may measure a RS that may be associated with a beam. The WTRU may measure, for example for TRP2, a set of RS where each RS may be associated with an ID, an index, and/or a beam. The WTRU may determine a best or preferred RS, index, and/or beam, for example for TRP2. It should be noted that the terms beam, index, Id, and RS may be substituted for each other in the examples and embodiments described herein and still be consistent.

A WTRU may determine, transmit and/or report (e.g., transmit a report containing) information regarding TRP2 (e.g., TRP2-information) to TRP1. The TRP2-information may comprise at least one of the following:

A RS measurement that may be associated with a beam;

A set of RS measurements that may be associated with one or more beams (e.g., each RS measurement may be associated with a beam);

A best or preferred RS measurement that may be associated with a beam; and

An indication of a preferred or best RS measurement, index, and/or beam, a set of beams or beam IDs, and a best or preferred beam or beam ID. A beam ID may be a SYNC timeslot index, SYNC symbol index, SS block index, SS block time index or the like.

The TRP2-information may be associated with a common channel or a WTRU-specific channel. A common channel may be a sync channel, a broadcast channel, and/or a control channel. A WTRU-specific channel may be a data channel. The WTRU may send a report indicating a first RS or a first beam that may correspond to a preferred beam for a common channel. The WTRU may send a report indicating a second RS or a second beam that may correspond to a preferred beam for a WTRU-specific channel. The first and second RS or beam may be the same or different.

TRP1 may determine WTRU-assistance data and/or TRP-assistance data based on TRP2-information it receives from the WTRU. The WTRU-assistance data and/or TRP-assistance data may include at least a subset of TRP2-information.

TRP1 may indicate to a WTRU to receive a channel from TRP2. This may be based on the TRP2-information and/or based on the WTRU-assistance data it provides to the WTRU. TRP1 may indicate a beam on which to receive a channel from TRP2. The beam may be different from a preferred one indicated by the WTRU in TRP2-information.

The WTRU may receive a channel from TRP2 based on the TRP2-information it determined and/or transmitted. The WTRU may receive a channel from TRP2 based on information (e.g., revised TRP2-information) received from TRP1. The WTRU may receive a channel from TRP2 based on the WTRU-assistance data received from TRP1

The WTRU may transmit TRP2-information to TRP1 in at least one of the following ways: RRC signaling, MAC signaling, such as in a MAC Control element (MAC-CE), or in the physical layer.

The WTRU may provide TRP-2 information in UL control information (UCI) or via an UL control channel. The UCI format or control channel may be such that the resources used may indicate a beam or set of beams. The UCI or control channel may be such that one or more bits may be used to represent a beam or set of beams.

TRP1 may trigger the WTRU to perform an UL procedure with TRP2, such as a random access procedure or a beam pairing procedure. TRP1 may indicate to the WTRU on which set of beams it is to transmit and the timing associated with the beams (e.g., each of the beams in the set).

TRP1 may indicate a set of reference signals that the WTRU may transmit where an RS may be associated with a beam. TRP1 may indicate the timing and/or resources for transmission of an RS. The trigger may be provided via a DL control channel or DCI that may be provided by TRP1 and/or received by the WTRU. In response to the trigger, the WTRU may transmit to TRP2 on resources associated with one or more beams. The WTRU may transmit an indicated reference signal that may be associated with a beam according to the timing associated with the RS or beam. The association may be configured, for example, by TRP1.

Figure 31:
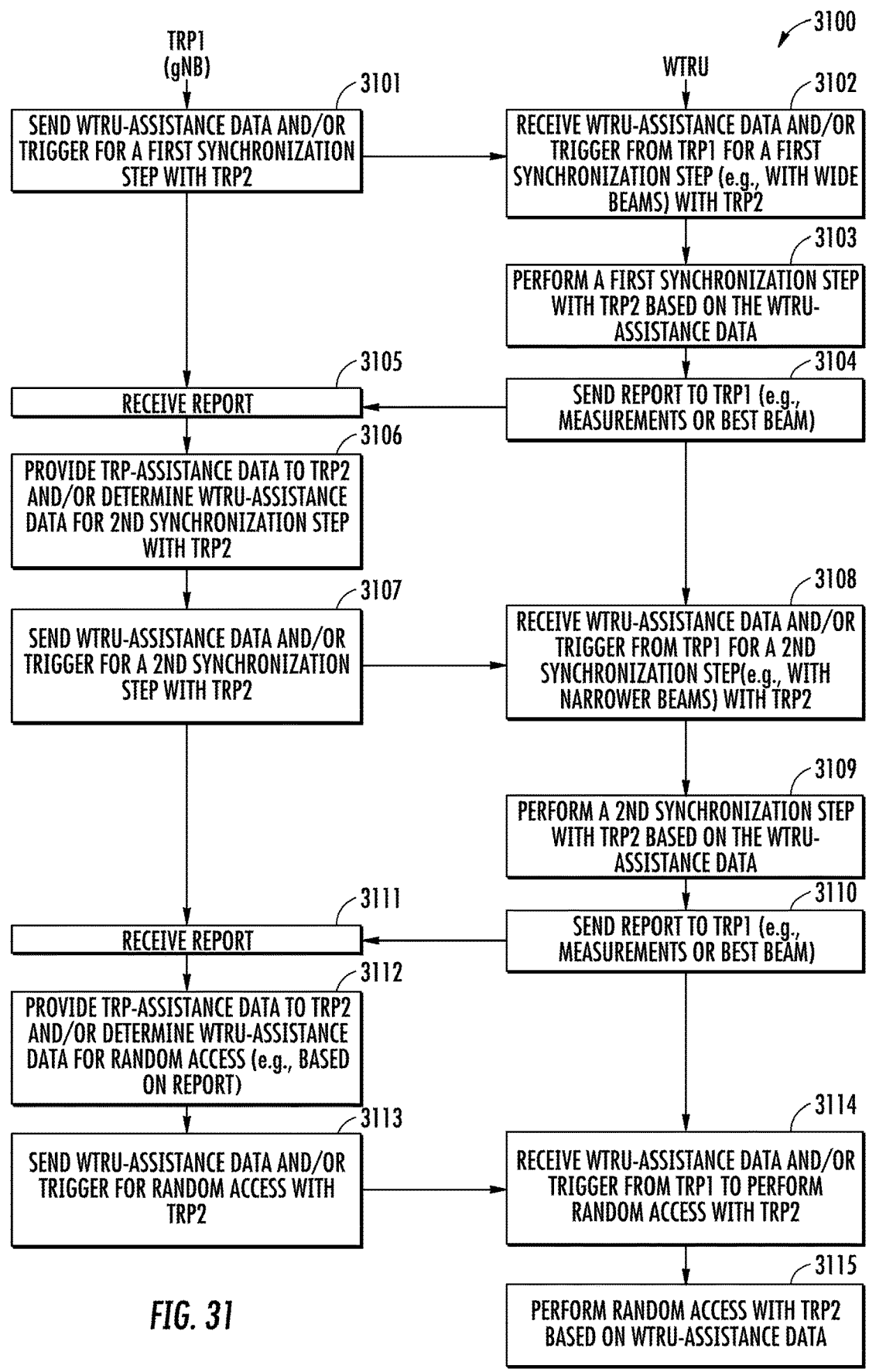
FIG. 31 is an example of an initial access procedure with a combination of hierarchical synchronization and beam-centric designs.

FIG. 31 is an example of an initial access procedure with a combination of hierarchical synchronization and beam-centric designs 3100. The hierarchical beam-based initial synchronization procedure may include multiple steps, where subsequent steps may use different beams or a different beam sweep method or procedure. Procedures that may be used include forward hierarchical beam sweeping using successively narrower beams, or backward hierarchical beam sweeping using successively wider beams. An initial synchronization step may include at least one of: synchronization, receiving and/or measuring a reference signal (e.g., beam reference signal (BRS)), receiving a channel such as a broadcast channel (e.g., PBCH) and/or a control channel, and/or reporting at least one measurement or a beam (e.g., a preferred beam or set of beams).

Referring to FIG. 31, TRP1 may send WTRU-assistance data and/or trigger the WTRU to perform a hierarchical beam-based initial synchronization procedure with TRP2 3101. The WTRU-assistance data may be for one or more of the synchronization steps, such as the first synchronization step. The WTRU may receive the WTRU-assistance data and/or trigger from TRP1 for the first synchronization step with TRP2 (e.g. with wide beams) 3102. The WTRU may perform the synchronization step with TRP2 based on the WTRU-assistance data 3103. The WTRU may then send a report to TRP1, which may include for example measurements or a best beam 3104. TRP1 may then receive the report 3105, and then may provide TRP-assistance data to TRP2 and/or determine WTRU-assistance data for the second synchronization step 3106, which may for example be based on the report. The TRP-assistance data may include one or more parameters that may enable TRP2 to perform a beam sweep (e.g., an efficient beam sweep) for the transmission and/or reception of cell-specific, beam-specific, and/or WTRU-specific signals.

TRP1 may then send WTRU-assistance data and/or trigger the WTRU to perform a second synchronization step with TRP2 3107. The WTRU may receive the WTRU-assistance data and/or trigger from TRP1 for the second synchronization step with TRP2 (e.g. with narrower beams) 3108. The WTRU may then send a report to TRP1, which may include for example measurements or a best beam 3110. TRP1 may then receive the report 3111, and then may provide TRP-assistance data to TRP2 and/or determine WTRU-assistance data for a random access procedure 3112, which may for example be based on the report. TRP1 may then send WTRU-assistance data and/or trigger the WTRU to perform a random access procedure with TRP2 3113. The WTRU may receive the WTRU-assistance data and/or trigger from TRP1 for the random access procedure with TRP2 3114. The WTRU may then perform the random access procedure with TRP2 based on the WTRU-assistance data 3115.

Figure 32:
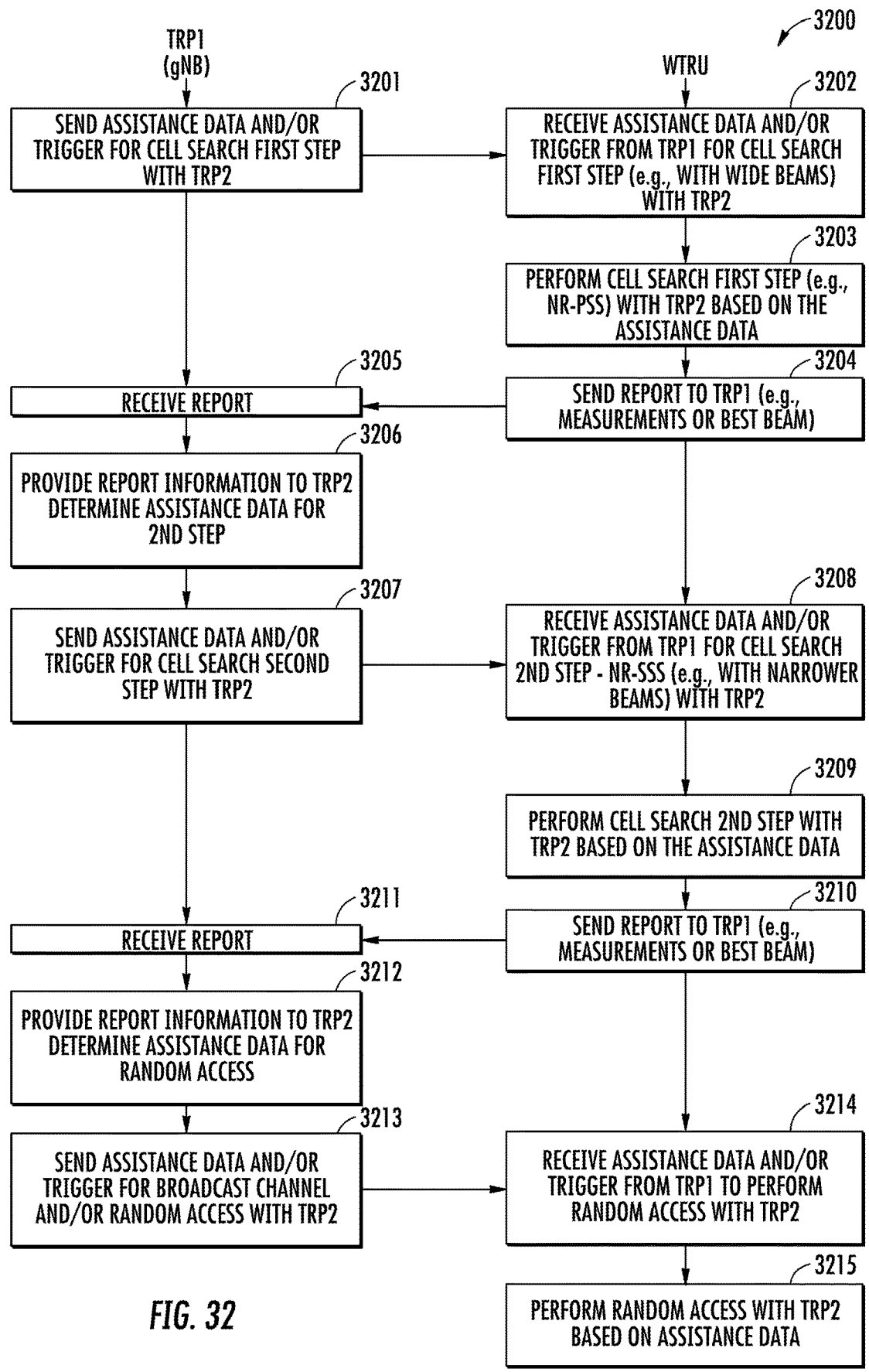
FIG. 32 is an example of an initial access procedure with joint designs for hierarchical SS (1st step NR-PSS and 2nd step NR-SSS) and hierarchical beam-centric designs (1st stage and 2nd stage).

FIG. 32 is an example of an initial access procedure with joint designs for hierarchical SS (1st step NR-PSS and 2nd step NR-SSS) and hierarchical beam-centric designs (1st stage and 2nd stage) 3200. TRP1 may send assistance data and/or trigger the WTRU to perform a cell search first step with TRP2 3201. The WTRU may receive the assistance data and/or trigger from TRP1 for the cell search first step with TRP2 (e.g. with wide beams) 3202. The WTRU may perform the first step (e.g., NR-PSS) with TRP2 based on the assistance data 3203. The WTRU may then send a report to TRP1, which may include for example measurements or a best beam 3204. TRP1 may then receive the report 3205, and then may provide report information to TRP2 and/or determine assistance data for the second step 3206. TRP1 may then send assistance data and/or trigger the WTRU to perform a cell search second step with TRP2 3207. The WTRU may receive the assistance data and/or trigger from TRP1 for the cell search second step with TRP2 (e.g. with narrower beams) 3208. The WTRU may then send a report to TRP1, which may include for example measurements or a best beam 3210. TRP1 may then receive the report 3211, and then may provide report information to TRP2 and/or determine assistance data for a random access procedure 3212. TRP1 may then send assistance data and/or trigger the WTRU for broadcast channel or random access with TRP2 3213. The WTRU may receive the assistance data and/or trigger from TRP1 for the random access procedure with TRP2 3214. The WTRU may then perform the random access procedure with TRP2 based on the assistance data 3215.

Although features and elements are described above in particular combinations, one of ordinary skill in the art will appreciate that each feature or element can be used alone or in any combination with the other features and elements. In addition, the methods described herein may be implemented in a computer program, software, or firmware incorporated in a computer-readable medium for execution by a computer or processor. Examples of computer-readable media include electronic signals (transmitted over wired or wireless connections) and computer-readable storage media. Examples of computer-readable storage media include, but are not limited to, a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs). A processor in association with software may be used to implement a radio frequency transceiver for use in a WTRU, UE, terminal, base station, RNC, or any host computer.

What is claimed is:

1. A method for use in a base station, the method comprising:
   performing channel coding of a plurality of bits to produce coded bits using polar encoding, wherein the polar encoding provides at least a portion of the plurality of bits to bit channels based on content of the at least the portion of the plurality of bits and based on a reliability of the bit channels, wherein the plurality of bits includes bits of a master information block (MIB) transport block, other bits, and cyclic redundancy check (CRC) bits, wherein the plurality of bits indicates each of timing information and a system frame number (SFN);
   performing rate matching via repetition on the coded bits; and
   sending the rate matched coded bits in a physical broadcast channel (PBCH) transmission.

2. The method of claim 1, further comprising polar encoding and sending bits associated with a synchronization signal (SS) block index in the PBCH transmission.

3. The method of claim 1, wherein the other bits include beam information bits.

4. The method of claim 1, further comprising:
   polar encoding and sending control resource set information in the PBCH transmission.

5. The method of claim 1, wherein the bits that indicate timing information and the CRC bits are provided to reliable bit channels.

6. The method of claim 1, further comprising:
   prioritizing the bits of the MIB transport block, the other information bits, and the CRC bits in the plurality of bits for channel encoding based on content.

7. The method of claim 1, wherein the other bits include bits that indicate the SFN.

8. A base station comprising:
   a processor configured to perform channel coding of a plurality of bits to produce coded bits using polar encoding, wherein the polar encoding provides at least a portion of the plurality of bits to bit channels based on content of the at least the portion of the plurality of bits and based on a reliability of the bit channels, wherein the plurality of bits includes bits of a master information block (MIB) transport block, other bits, and cyclic redundancy check (CRC) bits, wherein the plurality of bits indicates each of timing information and a system frame number (SFN);
   the processor further configured to perform rate matching via repetition on the coded bits; and
   a transmitter configured to send the rate matched coded bits in a physical broadcast channel (PBCH) transmission.

9. The base station of claim 8, wherein the processor is further configured to polar encode a synchronization signal (SS) block index and the transmitter is further configured to send the SS block index in the PBCH transmission.

10. The base station of claim 8, wherein the other bits include beam information bits.

11. The base station of claim 8, wherein the processor further is configured to polar encode control resource set information and the transmitter is further configured to send the control resource set information in the PBCH transmission.

12. The base station of claim 8, wherein the bits that indicate timing information and the CRC bits are provided to reliable bit channels.

13. The base station of claim 8, wherein the processor is further configured to prioritize the bits of the MIB transport block, the other information bits, and the CRC bits in the plurality of bits for channel encoding based on content.

14. The base station of claim 8, wherein the other bits include bits that indicate the SFN.

15. A wireless transmit/receive unit (WTRU) comprising:
a transceiver; and
a processor,
wherein the transceiver and the processor are configured to receive and decode a signal on a physical broadcast channel (PBCH) to recover a plurality of polar encoded bits wherein at least a portion of the plurality of bits is provided to bit channels based on content of the at least the portion of the plurality of bits and based on a reliability of the bit channels, wherein the plurality of bits includes bits of a master information block (MIB) transport block, other bits, and cyclic redundancy (CRC) bits, wherein the plurality of bits indicates each of timing information and a system frame number (SFN), and the signal has the polar encoded bits rate matched by repetition.

16. The WTRU of claim 15, wherein the transceiver and the processor are further configured to receive and decode bits associated with a synchronization signal (SS) block index from the PBCH.

17. The WTRU of claim 15, wherein the other bits include beam information bits.

18. The WTRU of claim 15, wherein the transceiver and the processor are further configured to receive and decode control resource set information from the PBCH.

19. The WTRU of claim 15, wherein the bits that indicate timing information and the CRC bits are provided to reliable bit channels.

20. The WTRU of claim 15, wherein the other bits include bits that indicate the SFN.

* * * * *